(12) United States Patent
Tischler et al.

(10) Patent No.: US 8,933,478 B2
(45) Date of Patent: Jan. 13, 2015

(54) ENGINEERED-PHOSPHOR LED PACKAGES AND RELATED METHODS

(71) Applicants: Michael A. Tischler, Vancouver (CA); Ian Ashdown, West Vancouver (CA); Tom Pinnington, Vancouver (CA); Henry Ip, Richmond (CA)

(72) Inventors: Michael A. Tischler, Vancouver (CA); Ian Ashdown, West Vancouver (CA); Tom Pinnington, Vancouver (CA); Henry Ip, Richmond (CA)

(73) Assignee: Cooledge Lighting Inc., Burnaby (CA)

( * ) Notice: Subject to any disclaimer, the term of this patent is extended or adjusted under 35 U.S.C. 154(b) by 0 days.

(21) Appl. No.: 14/166,329

(22) Filed: Jan. 28, 2014

(65) Prior Publication Data

US 2014/0231850 A1    Aug. 21, 2014

Related U.S. Application Data

(63) Continuation-in-part of application No. 13/770,432, filed on Feb. 19, 2013, now Pat. No. 8,754,435.

(51) Int. Cl.
*H01L 33/50* (2010.01)

(52) U.S. Cl.
CPC .................................... *H01L 33/502* (2013.01)
USPC ......................................................... 257/98

(58) Field of Classification Search
USPC ........ 257/98, 100, E33.059, E33.06, E33.061
See application file for complete search history.

(56) References Cited

U.S. PATENT DOCUMENTS

| | | | |
|---|---|---|---|
| 5,998,925 A | 12/1999 | Shimizu et al. | |
| 6,157,126 A * | 12/2000 | Yano et al. | 313/485 |
| 6,414,426 B1 * | 7/2002 | Akashi et al. | 313/486 |
| 6,445,119 B1 * | 9/2002 | Mori et al. | 313/485 |
| 6,476,369 B1 | 11/2002 | Matsumoto | |
| 6,635,363 B1 | 10/2003 | Duclos et al. | |
| 6,637,924 B2 | 10/2003 | Pelka et al. | |
| 6,653,765 B1 | 11/2003 | Levinson et al. | |
| 6,890,234 B2 | 5/2005 | Bortscheller et al. | |
| 7,084,434 B2 | 8/2006 | Erchak et al. | |
| 7,360,924 B2 | 4/2008 | Henson et al. | |
| 7,462,878 B2 | 12/2008 | Richter et al. | |
| 7,531,960 B2 | 5/2009 | Shimizu et al. | |
| 7,532,800 B2 | 5/2009 | Iimura | |
| 7,722,211 B2 | 5/2010 | Marra et al. | |
| 7,791,093 B2 | 9/2010 | Basin et al. | |
| 7,791,274 B2 | 9/2010 | Yano et al. | |
| 7,843,642 B2 | 11/2010 | Shaoulov et al. | |
| 7,858,408 B2 | 12/2010 | Mueller et al. | |
| 7,868,341 B2 | 1/2011 | Diana et al. | |
| 7,872,417 B2 | 1/2011 | Nakamura et al. | |
| 7,929,816 B2 | 4/2011 | Meir et al. | |
| 7,936,119 B2 | 5/2011 | Cheng | |
| 7,943,952 B2 | 5/2011 | Loh et al. | |
| 7,952,107 B2 | 5/2011 | Daniels et al. | |
| 7,952,110 B2 | 5/2011 | Haase | |
| 1,016,368 A1 | 7/2011 | Steele et al. | |
| 1,017,553 A1 | 7/2011 | Holman et al. | |
| 7,994,529 B2 | 8/2011 | Bierhuizen et al. | |

(Continued)

FOREIGN PATENT DOCUMENTS

JP    2010045248    2/2010
JP    2011077214    4/2011

(Continued)

*Primary Examiner* — Michele Fan
(74) *Attorney, Agent, or Firm* — Bingham McCutchen LLP

(57) ABSTRACT

In accordance with certain embodiments, regions of spatially varying wavelength-conversion particle concentration are formed over light-emitting dies.

29 Claims, 14 Drawing Sheets

(56) References Cited

U.S. PATENT DOCUMENTS

| | | |
|---|---|---|
| 8,004,172 B2 | 8/2011 | Hussell et al. |
| 8,038,497 B2 | 10/2011 | Le Toquin |
| 8,058,088 B2 | 11/2011 | Cannon et al. |
| 8,128,272 B2 | 3/2012 | Fine et al. |
| 8,129,730 B2 | 3/2012 | Daniels |
| 8,167,674 B2 | 5/2012 | Hussell et al. |
| 8,168,998 B2 | 5/2012 | David et al. |
| 8,686,625 B1* | 4/2014 | Ashdown et al. .............. 313/501 |
| 2004/0207998 A1* | 10/2004 | Suehiro et al. ................. 362/84 |
| 2005/0156496 A1* | 7/2005 | Takashima et al. ........... 313/237 |
| 2005/0205876 A1 | 9/2005 | Harada et al. |
| 2007/0013057 A1 | 1/2007 | Mazzochette |
| 2007/0228387 A1 | 10/2007 | Negley et al. |
| 2008/0054279 A1 | 3/2008 | Hussell et al. |
| 2008/0225549 A1 | 9/2008 | Dassanayake et al. |
| 2008/0308825 A1* | 12/2008 | Chakraborty et al. .......... 257/98 |
| 2009/0001397 A1 | 1/2009 | Fine et al. |
| 2009/0141476 A1 | 6/2009 | Meir et al. |
| 2009/0152573 A1 | 6/2009 | Loh et al. |
| 2010/0013374 A1* | 1/2010 | Maruyama et al. ........... 313/502 |
| 2010/0044667 A1 | 2/2010 | Park et al. |
| 2010/0052006 A1* | 3/2010 | Takeda et al. ................. 257/100 |
| 2010/0067233 A1 | 3/2010 | Bechtel et al. |
| 2010/0127293 A1 | 5/2010 | Sommer et al. |
| 2010/0165624 A1 | 7/2010 | Ogawa et al. |
| 2010/0265693 A1 | 10/2010 | Ryu et al. |
| 2010/0289405 A1 | 11/2010 | Maruyama et al. |
| 2010/0315817 A1 | 12/2010 | Zimmermann |
| 2011/0133220 A1 | 6/2011 | Kim et al. |
| 2011/0220920 A1 | 9/2011 | Collins et al. |
| 2011/0254040 A1 | 10/2011 | Nagai |
| 2012/0002282 A1 | 1/2012 | Nagahama et al. |
| 2012/0025245 A1 | 2/2012 | Nakamura et al. |
| 2012/0032220 A1 | 2/2012 | Cannon et al. |
| 2012/0087105 A1 | 4/2012 | Dai et al. |
| 2013/0016296 A1 | 1/2013 | Fujita et al. |
| 2013/0141013 A1* | 6/2013 | Kodama et al. ............... 315/294 |
| 2013/0292709 A1* | 11/2013 | Tong et al. ...................... 257/88 |

FOREIGN PATENT DOCUMENTS

| | | |
|---|---|---|
| WO | WO-2010038097 | 4/2010 |
| WO | WO-2011005300 | 1/2011 |
| WO | WO-2011109088 | 9/2011 |
| WO | WO-2011109192 | 9/2011 |
| WO | WO-2011141779 A1 | 11/2011 |

* cited by examiner

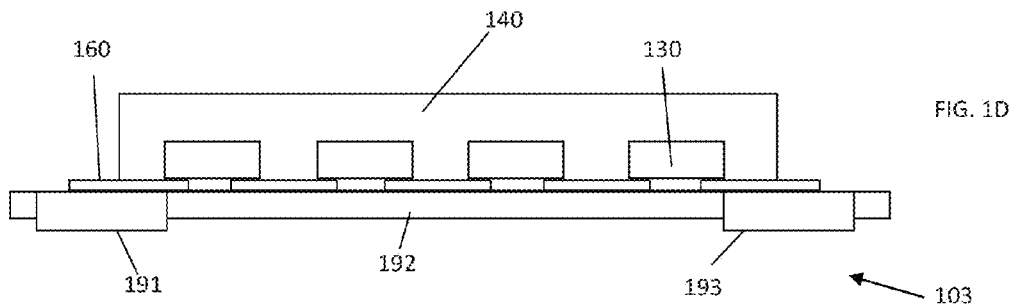
FIG. 1D
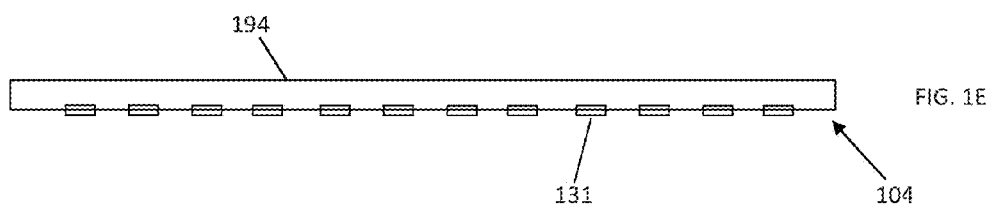
FIG. 1E
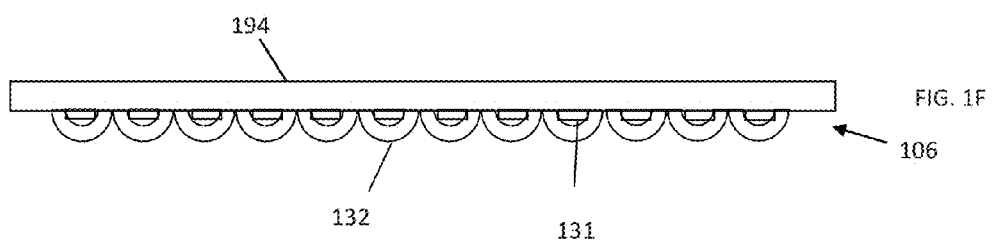
FIG. 1F
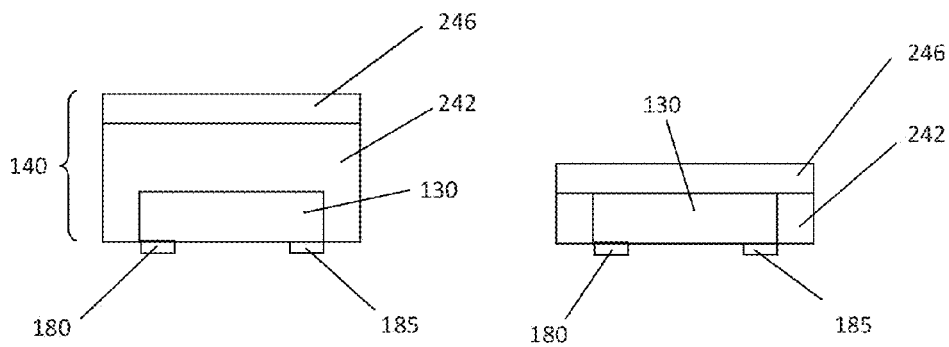
FIG. 2A
FIG. 2B

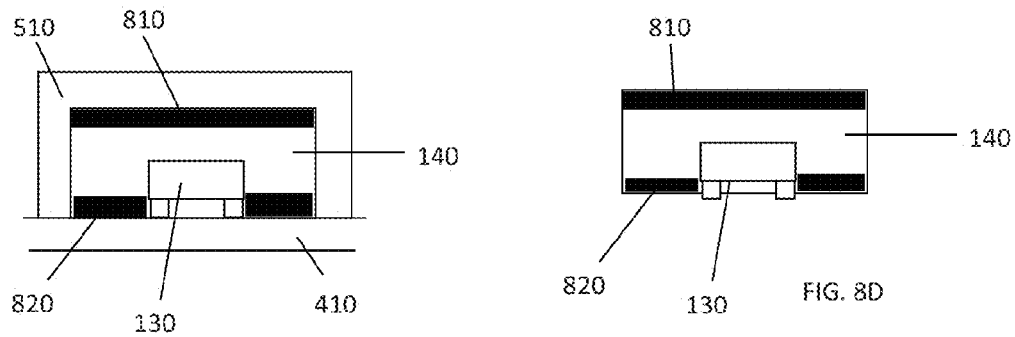
FIG. 8C
FIG. 8D
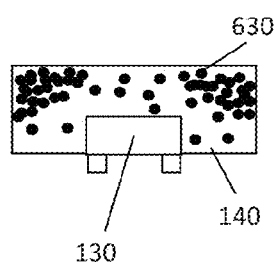
FIG. 9A
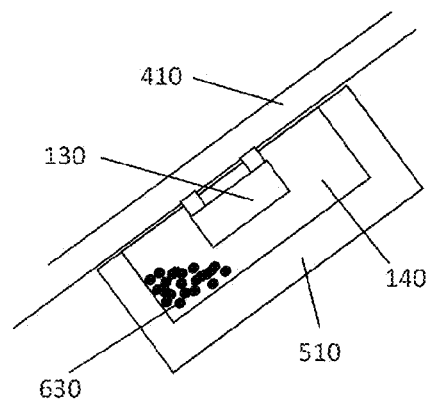
FIG. 9B
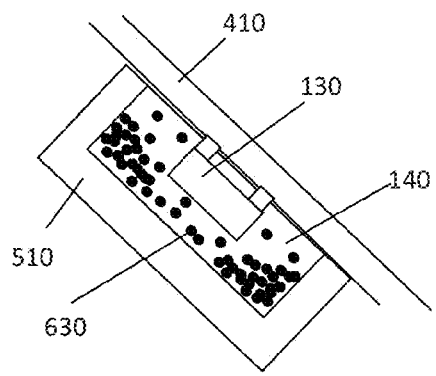
FIG. 9C

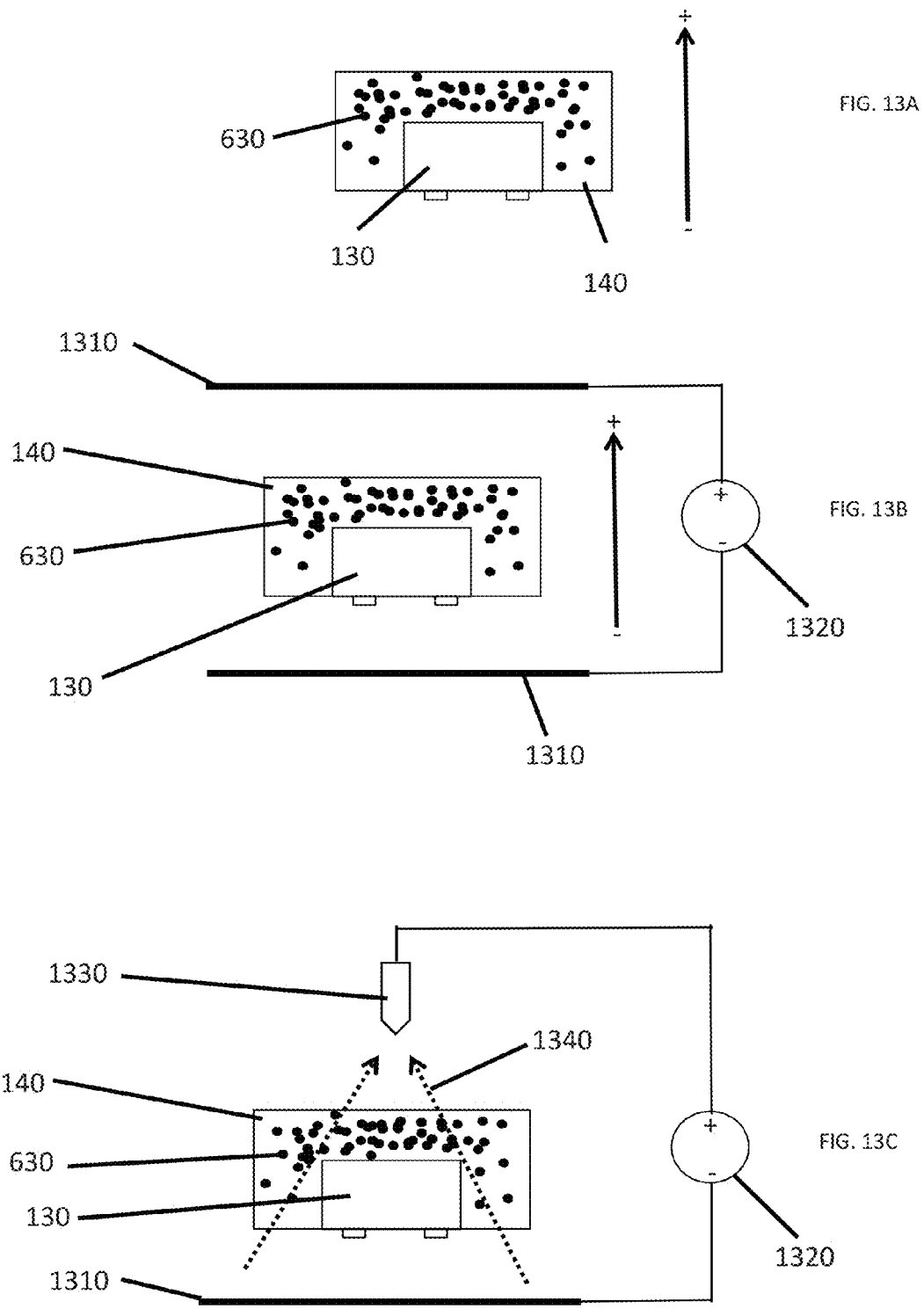

ENGINEERED-PHOSPHOR LED PACKAGES AND RELATED METHODS

RELATED APPLICATION

This application is a continuation-in-part of U.S. patent application Ser. No. 13/770,432, filed Feb. 19, 2013, the entire disclosure of which is incorporated by reference herein.

FIELD OF THE INVENTION

In various embodiments, the present invention generally relates to light-emitting diodes (LEDs) and, in particular, to LED dies packaged with engineered phosphor layers.

BACKGROUND

An increasing number of light fixtures utilize LEDs as light sources due to their lower energy consumption, smaller size, improved robustness, and longer operational lifetime relative to conventional filament-based light sources. Conventional LEDs emit quasi-monochromatic radiation ranging from infrared through the visible spectrum to ultraviolet. Conventional LEDs emit light at a particular wavelength, ranging from, for example, red to blue or ultraviolet (UV) light. However, for purposes of general illumination, the relatively narrow spectral width of light emitted light by LEDs is generally converted to broad-spectrum white light.

Traditionally, there are two ways of obtaining white light from LEDs. One approach utilizes two or more LEDs operating at different wavelengths, where the different wavelengths are chosen such that their combination appears white to the human eye. For example, one may use LEDs emitting in the red, green, and blue wavelength ranges. Such an arrangement typically requires careful control of the operating currents of each LED, such that the resulting combination of wavelengths is stable over time and different operating conditions, for example temperature. Because the different LEDs may be formed from different materials, different operating parameters may be required for the different LEDs; this complicates the LED circuit design. Furthermore, such systems typically require some form of light combiner, diffuser or mixing chamber, so that the eye sees white light rather than the distinct colors of each of the different LEDs. Such light-mixing systems typically add cost and bulk to lighting systems and may reduce their efficiency.

White light may also be produced in LED-based systems for general illumination via the utilization of light-conversion materials such as phosphors, sometimes called phosphor-converted LEDs. For example, an LED combined with a wavelength-conversion element (WCE) generates white light by combining the short-wavelength radiant flux (e.g., blue light) emitted by the semiconductor LED with long-wavelength radiant flux (e.g., yellow light) emitted by, for example one or more phosphors within the WCE. The chromaticity (or color), color temperature, and color-rendering index are determined by the relative intensities of the component colors. For example, the light color may be adjusted from "warm white" with a correlated color temperature (CCT) of 2700 Kelvin or lower to "cool white" with a CCT of 6500 Kelvin or greater by varying the type or amount of phosphor material. White light may also be generated solely or substantially only by the light emitted by the one or more phosphor particles within the WCE. A WCE may also be referred to as a phosphor conversion element (PCE) or a phosphor.

PCEs may be positioned in contact with the LED die or positioned apart—that is, remotely from the LED; in this configuration, the PCE is called a "remote phosphor." Both remote-phosphor and contact-phosphor configurations produce a non-uniform color distribution as a function of the emission angle from the LED-based illumination system, thereby reducing the quality of light and the suitability of the light source for lighting products. Non-uniformity of the angular color distribution from phosphor-converted LEDs (PCLED) results from differences in the angular intensity distributions of the LED light and the phosphor-converted light. For example, the LED typically exhibits a Lambertian luminous intensity distribution pattern, while emission from the phosphor typically exhibits a substantially isotropic luminous intensity distribution. In the case of a phosphor-converted white LED, the blue light emitted from an LED die has a non-isotropic color distribution (such as a Lambertian distribution) whereas light converted by a PCE with a yellow emission peak has a substantially isotropic color distribution. As a consequence, the chromaticity of the combined light varies with viewing angle, resulting in a non-uniform color distribution as seen by the human eye. For example, a phosphor-coated blue LED may be typically perceived as being cool white when viewed head-on, but warm white when viewed obliquely.

Lighting and illumination systems that include LEDs frequently suffer from the angularly dependent color non-uniformity of phosphor-converted LEDs. In order to mitigate the relatively poor angular color uniformity of conventional phosphor-converted LEDs, such illumination systems often require additional elements, such as diffusers, mixing chambers, or the like, to homogenize the color characteristics. Such homogenization often degrades the light-intensity distribution pattern, however, resulting in the need for secondary optics to re-establish the desired light-intensity distribution pattern. The addition of these elements typically requires undesirable additional space or volume, adds cost and expense, and reduces output efficiency.

Accordingly, there is a need for structures, systems and procedures enabling LED-based illumination systems to generate uniform color distribution of light and operate with high extraction efficiency while utilizing low-cost integration of phosphors with the LEDs.

SUMMARY

In accordance with certain embodiments, the phosphor-containing region of a light-emitting element (LEE) is engineered such that the light emitted by the LEE has a desired color distribution. For example, gradients in phosphor-particle concentration that increase or decrease perpendicular to an emission face of the LEE (and/or parallel to a sidewall of the LEE), rather than varying radially with respect to the LEE, may be formed. Moreover, embodiments of the invention enable more complicated distributions of phosphor particles within a binder (e.g., resinous) disposed on the LEE. For example, phosphor particles may be disposed within multiple distinct regions, separated from each other by at least one region substantially free of phosphor particles. Additionally, multiple different gradients or distributions may be formed by at least partially curing the binder (or curing only a portion of the binder) during the application of a specific settling force (i.e., a force acting to spatially redistribute the phosphor particles within the binder), and then performing additional curing during the application of a different "non-neutral-gravity" settling force, i.e., a settling force that is not merely gravitational force acting on an untilted LEE die (such that gravity acts perpendicular to a top emission face, for example). Exemplary techniques of applying a non-neutral-gravity settling force include (i) tilting the LEE die so that gravitational force acts along a particular direction with respect to the die (e.g., not perpendicular to the top or bottom faces of the die), (ii) rotating the die around a fixed axis (e.g., in a centrifuge), (iii) applying an electric field across the binder, and/or (iv) applying acoustic energy to the binder. Accordingly, embodiments of the invention facilitate engineered phosphor distributions that correct LED (or other LEE) color non-uniformities and/or provide desired light distributions.

In an aspect, embodiments of the invention feature a light-emitting device including or consisting essentially of a bare light-emitting die, a binder, and, disposed within the binder, a plurality of wavelength-conversion particles for absorbing at least a portion of light emitted from the light-emitting die and emitting converted light having a different wavelength, converted light and unconverted light emitted by the light-emitting die combining to form substantially white light. The die has (i) a top face and a bottom face opposite the top face, at least one of the top or bottom face being configured for emission of light therefrom, and (ii) a sidewall spanning the top and bottom faces. The binder has top and bottom surfaces, at least one of which is substantially parallel to the top face of the die. At least a portion of the binder extends laterally beyond the sidewall of the die, and at least a portion of the binder is disposed over the top face of the die. The concentration of the wavelength-conversion particles varies in a direction substantially perpendicular to one of the top or bottom faces without varying radially toward or away from the die.

Embodiments of the invention include one or more of the following features in any of a variety of combinations. The concentration of the wavelength-conversion particles may increase in a direction extending from the top face of the die to the bottom face of the die. The concentration of the wavelength-conversion particles may decrease in a direction extending from the top face of the die to the bottom face of the die. A portion of the binder may extend proximate the sidewall of the die below a plane defined by the top face of the die. A portion of the binder may be substantially free of wavelength-conversion particles. The light-emitting die may include or consist essentially of a light-emitting diode die. The light-emitting die may include or consist essentially of a GaN-based semiconductor material (e.g., GaN, AlGaN, AlInGaN, InGaN, and/or alloys thereof). The semiconductor material may include In. The light-emitting die may emit blue or ultraviolet light. The wavelength-conversion particles may include or consist essentially of phosphor particles. The phosphor particles may include or consist essentially of garnet and a rare-earth element. The divergence of color temperature of the substantially white light emitted from the device may vary, over an angular range of 0° to 70°, 75°, or 80°, no more than 0.01 (or even no more than 0.005 over an angular range of 10° to 70° or 75°) in terms of Δu'v' deviation from a spatially weighted averaged chromaticity. The device may include a substrate (i) having at least two conductive traces thereon and (ii) disposed proximate the bottom face of the light-emitting die. A contact pad may be disposed on the light-emitting die and electrically connected to a conductive trace on the substrate. The contact pad may be electrically connected to the conductive trace by (i) a wire bond, (ii) a solder joint, (iii) an anisotropic conductive adhesive, and/or (iv) a conductive adhesive. The substrate may include or consist essentially of a leadframe. The substrate may include or consist essentially of a rigid material selected from the group consisting of Si, SiC, AlN, AlON, sapphire, silicon oxide, SiAlON, SiCAlON, and alloys thereof. At least a portion of the light-emitting die and at least a portion of the substrate may be disposed within a package. The package may include or consist essentially of a plastic material and/or a ceramic material.

In another aspect, embodiments of the invention feature a light-emitting device including or consisting essentially of a bare light-emitting die, a binder, and, disposed within the binder, a plurality of wavelength-conversion particles for absorbing at least a portion of light emitted from the light-emitting die and emitting converted light having a different wavelength, converted light and unconverted light emitted by the light-emitting die combining to form substantially white light. The die has (i) a top face and a bottom face opposite the top face, at least one of the top or bottom face being configured for emission of light therefrom, and (ii) a sidewall spanning the top and bottom faces. The binder has top and bottom surfaces, at least one of which is substantially parallel to the top face of the die. At least part of the binder extends laterally beyond the sidewall of the die, and at least part of the binder is disposed over the top face of the die. In a first portion of the binder disposed between the top face of the die and the top surface of the binder, the concentration of the wavelength-conversion particles increases in a first direction. In a second portion of the binder disposed between the top face of the die and the top surface of the binder, the concentration of the wavelength-conversion particles increases in a second direction different from the first direction, the concentration of the wavelength-conversion particles not varying radially toward or away from the die.

Embodiments of the invention include one or more of the following features in any of a variety of combinations. A portion of the binder may extend proximate the sidewall of the die below a plane defined by the top face of the die. A portion of the binder may be substantially free of wavelength-conversion particles. The light-emitting die may include or consist essentially of a light-emitting diode die. The light-emitting die may include or consist essentially of a GaN-based semiconductor material. The semiconductor material may include In. The light-emitting die may emit blue or ultraviolet light. The wavelength-conversion particles may include or consist essentially of phosphor particles. The phosphor particles may include or consist essentially of garnet and a rare-earth element. The wavelength-conversion particles may include or consist essentially of quantum dots. The divergence of color temperature of the substantially white light emitted from the device may vary, over an angular range of 0° to 70°, 75°, or 80°, no more than 0.01 (or even no more than 0.005 over an angular range of 10° to 70° or) 75° in terms of Δu'v' deviation from a spatially weighted averaged chromaticity.

In yet another aspect, embodiments of the invention feature a light-emitting device including or consisting essentially of a bare light-emitting die, a binder, and, disposed within the binder, a plurality of wavelength-conversion particles for absorbing at least a portion of light emitted from the light-emitting die and emitting converted light having a different wavelength, converted light and unconverted light emitted by the light-emitting die combining to form substantially white light. The die has (i) a top face and a bottom face opposite the top face, at least one of the top or bottom face being configured for emission of light therefrom, and (ii) a sidewall spanning the top and bottom faces. The binder has top and bottom surfaces, at least one of which is substantially parallel to the top face of the die. At least part of the binder extends laterally beyond the sidewall of the die, and at least part of the binder is disposed over the top face of the die. The binder includes a plurality of spatially distinct conversion regions each comprising wavelength-conversion particles therewithin, the distinct regions being separated from each other by at least one transmission region of the binder substantially free of wavelength-conversion particles.

Embodiments of the invention include one or more of the following features in any of a variety of combinations. At least one conversion region may be disposed proximate (and may even share an interface with) the top surface of the binder, and at least one conversion region may be disposed proximate (and may even share an interface with) the bottom surface of the binder. A portion of the binder may extend proximate the sidewall of the die below a plane defined by the top face of the die. The light-emitting die may include or consist essentially of a light-emitting diode die. The light-emitting die may include or consist essentially of a GaN-based semiconductor material. The semiconductor material may include In. The light-emitting die may emit blue or ultraviolet light. The wavelength-conversion particles may include or consist essentially of phosphor particles. The phosphor particles may include or consist essentially of garnet and a rare-earth element. The wavelength-conversion particles may include or consist essentially of quantum dots. The divergence of color temperature of the substantially white light emitted from the device may vary, over an angular range of 0° to 70°, 75°, or 80°, no more than 0.01 (or even no more than 0.005 over an angular range of 10° to 70° or) 75° in terms of $\Delta u'v'$ deviation from a spatially weighted averaged chromaticity.

In a further aspect, embodiments of the invention feature a method of fabricating a phosphor-converted light-emitting element including or consisting essentially of a bare light-emitting die having (i) a top face and a bottom face opposite the top face, at least one of the top or bottom face being configured for emission of light therefrom, and (ii) a sidewall spanning the top and bottom faces. A binder is disposed over the top face of the die, the binder (i) having top and bottom surfaces, at least one of which is substantially parallel to the top face of the die, (ii) comprising a portion extending laterally beyond the sidewall of the die, and (iii) having, disposed therewithin, a plurality of wavelength-conversion particles for absorbing at least a portion of light emitted from the light-emitting die and emitting converted light having a different wavelength, converted light and unconverted light emitted by the light-emitting die combining to form substantially white light. A non-neutral-gravity settling force is applied to the wavelength-conversion particles, whereby the wavelength-conversion particles form a predetermined concentration gradient of wavelength-conversion particles in at least a portion of the binder. The binder is at least partially cured to fix the predetermined concentration gradient of wavelength-conversion particles in the at least a portion of the binder.

Embodiments of the invention include one or more of the following features in any of a variety of combinations. Applying the non-neutral-gravity settling force may include or consist essentially of (i) tilting the die whereby gravitational force acts along a direction not perpendicular to the top or bottom faces of the die, (ii) rotating the die around a fixed axis, (iii) applying an electric field across the binder, and/or (iv) applying acoustic energy to the binder. Applying the non-neutral-gravity settling force may include or consist essentially of rotating the die around a fixed axis in a centrifuge. Applying the non-neutral-gravity settling force may include or consist essentially of applying acoustic energy to the binder as a standing wave, wavelength-conversion particles being repelled from peaks in the standing wave and attracted to troughs in the standing wave. The binder may be at least partially cured while the non-neutral-gravity settling force is applied. At least partially curing the binder may include or consist essentially of (i) partially curing the binder while the non-neutral-gravity settling force is applied, and, (ii) after the partial cure, performing additional curing of the binder while or after applying a second non-neutral-gravity settling force different from the non-neutral-gravity settling force. Applying the second non-neutral-gravity settling force may include or consist essentially of (i) tilting the die whereby gravitational force acts along a direction not perpendicular to the top or bottom faces of the die, (ii) rotating the die around a fixed axis, (iii) applying an electric field across the binder, and/or (iv) applying acoustic energy to the binder. After at least partially curing the binder, the divergence of color temperature of the substantially white light emitted from the phosphor-converted light-emitting element may vary, over an angular range of 0° to 70° or 80°, no more than 0.01 (or even no more than 0.005 over an angular range of 10° to 70° or 75°) in terms of $\Delta u'v'$ deviation from a spatially weighted averaged chromaticity. Applying the binder over the top face of the die may include or consist essentially of (i) disposing the binder in a mold, and (ii) disposing the die in the mold to at least partially surround the die with the binder. The binder may be at least partially cured while the die is disposed in the mold.

In yet a further aspect, embodiments of the invention feature a method of fabricating a plurality of phosphor-converted light-emitting elements each including or consisting essentially of at least one light-emitting die having (i) a top face and a bottom face opposite the top face, at least one of the top or bottom face being configured for emission of light therefrom, and (ii) a sidewall spanning the top and bottom faces. A binder is applied over the top faces of the dies to form a coated structure, the binder having, disposed therewithin, a plurality of wavelength-conversion particles for absorbing at least a portion of light emitted from the light-emitting dies and emitting converted light having a different wavelength, converted light and unconverted light emitted by the light-emitting dies combining to form substantially white light. A non-neutral-gravity settling force is applied to the wavelength-conversion particles, whereby the wavelength-conversion particles form predetermined concentration gradients of wavelength-conversion particles in portions of the binder proximate each of the dies. The binder is at least partially cured to fix the predetermined concentration gradients of wavelength-conversion particles in the portions of the binder. The coated structure is separated into a plurality of coated portions each including or consisting essentially of (i) a portion of the binder comprising a predetermined concentration gradient of wavelength-conversion particles and (ii) one or more light-emitting dies.

Embodiments of the invention include one or more of the following features in any of a variety of combinations. Each coated portion may contain one light-emitting die. In at least one of the coated portions, the binder (i) may have top and bottom surfaces, at least one of which is substantially parallel to the top face of the die, and (ii) may include a portion extending laterally beyond the sidewall of the die. One or more light-emitting dies may be disposed in a package before applying the binder over the top faces of the dies. One or more light-emitting dies may be disposed in a package after (i) applying the binder over the top faces of the dies, (ii) applying the non-neutral-gravity settling force to the wavelength-conversion particles, and (iii) at least partially curing the binder. One or more light-emitting dies may be disposed on a substrate. The one or more light-emitting dies may be disposed on the substrate before applying the binder over the top faces of the dies. The one or more light-emitting dies may be disposed on the substrate after (i) applying the binder over the top faces of the dies, (ii) applying the non-neutral-gravity settling force to the wavelength-conversion particles, and (iii) at least partially curing the binder. The substrate may include or consist essentially of a leadframe. The substrate may be removed from the one or more light-emitting dies (i.e., the substrate may be removed from the dies or the dies may be removed from the substrate) after at least partially curing the binder.

In another aspect, embodiments of the invention feature a light-emitting device that includes or consists essentially of a bare light-emitting die having (i) a top face and a bottom face opposite the top face, at least one of the top or bottom face being configured for emission of light therefrom, and (ii) a sidewall spanning the top and bottom faces, a binder having top and bottom surfaces, at least one of which is substantially parallel to the top face of the die, wherein at least a portion of the binder is disposed over the top face of the light-emitting die, and disposed within the binder, a plurality of wavelength-conversion particles for absorbing at least a portion of light emitted from the light-emitting die and emitting converted light having a different wavelength. Converted light and unconverted light emitted by the light-emitting die combine to form substantially white light. A divergence of color temperature of the substantially white light emitted from the light-emitting device varies, over an angular range of 0° to 70°, no more than 0.01 in terms of a deviation (e.g., a $\Delta u'v'$ deviation, where u' and v' are chromaticity coordinates on a chromaticity diagram) from a spatially weighted averaged chromaticity. The plurality of wavelength-conversion particles includes or consists essentially of a first plurality of wavelength-conversion particles of a first type and a second plurality of wavelength-conversion particles of a second type different from the first type. Throughout the binder, a concentration of the first plurality of wavelength-conversion particles relative to a total concentration of wavelength-conversion particles is within 20% of a concentration of the second plurality of wavelength-conversion particles relative to the total concentration of wavelength-conversion particles. The total concentration of the wavelength-conversion particles may vary in a direction substantially perpendicular to at least one of the top or bottom faces without varying radially toward or away from the light-emitting die.

Embodiments of the invention include one or more of the following features in any of a variety of combinations. At least a portion of the binder may extend laterally beyond the sidewall of the light-emitting die. The total concentration of the wavelength-conversion particles may vary substantially linearly in a portion or substantially all of the binder. The concentration of the first plurality of wavelength-conversion particles and/or the concentration of the second plurality of wavelength-conversion particles may vary substantially linearly in a portion or substantially all of the binder. The total concentration of the wavelength-conversion particles may vary substantially step-wise linearly in a portion or substantially all of the binder. The concentration of the first plurality of wavelength-conversion particles and/or the concentration of the second plurality of wavelength-conversion particles may vary substantially step-wise linearly in a portion or substantially all of the binder. Throughout the binder, the concentration of the first plurality of wavelength-conversion particles relative to the total concentration of wavelength-conversion particles may be within 10%, or even within 5%, of the concentration of the second plurality of wavelength-conversion particles relative to the total concentration of wavelength-conversion particles. Each of the first plurality of the wavelength-conversion particles may be coated with a coating material. The coating material may have a density greater than a density of the first type of wavelength-conversion particle. The first type of wavelength-conversion particle may have a first density, and the second type of wavelength-conversion particle may have a second density greater than the first density. The coating material may have a density less than a density of the first type of wavelength-conversion particle. The first type of wavelength-conversion particle may have a first density, and the second type of wavelength-conversion particle may have a second density less than the first density.

The index of refraction of the coating material may be substantially equal to the index of refraction of the binder. The index of refraction of the coating material may be between (i) an index of refraction of wavelength-conversion particles of the first and/or second types, and (ii) an index of refraction of the binder. The coating material and the binder may include or consist essentially of the same material. The coating material may form a visible and/or detectable interface with the binder even if the binder and the coating material include or consist essentially of the same material. The coating material and the binder may include or consist essentially of different materials. The total concentration of the wavelength-conversion particles may not vary radially toward or away from the light-emitting die within a plane parallel to the top and/or bottom faces of the light-emitting die. The first type of wavelength-conversion particle may emit light of a first color when excited by blue or ultraviolet radiation (e.g., from the light-emitting die). The second type of wavelength-conversion particle may emit light of a second color when excited by blue or ultraviolet radiation. The second color may be different from the first color. The first color may be yellow and/or green (i.e., yellow and green corresponds to yellow/green or yellowish green light), and/or the second color may be red.

The total concentration of the wavelength-conversion particles may increase in a direction extending from the top face of the light-emitting die to the bottom face of the light-emitting die. The total concentration of the wavelength-conversion particles may decrease in a direction extending from the top face of the light-emitting die to the bottom face of the light-emitting die. A portion of the binder may extend proximate the sidewall of the light-emitting die below a plane defined by the top face of the light-emitting die. A portion of the binder may be substantially free of wavelength-conversion particles. The light-emitting die may include or consist essentially of a light-emitting diode die. The light-emitting die may include or consist essentially of a GaN-based semiconductor material. The light-emitting die may emit blue light and/or ultraviolet light. The wavelength-conversion particles may include or consist essentially of phosphor particles. The phosphor particles may include or consist essentially of garnet and a rare-earth element. The divergence of color temperature of the substantially white light emitted from the device may vary, over an angular range of 0° to 80°, no more than 0.01 in terms of $\Delta u'v'$ deviation from a spatially weighted averaged chromaticity. The divergence of color temperature of the substantially white light emitted from the device may vary, over an angular range of 10° to 75°, no more than 0.005 in terms of $\Delta u'v'$ deviation from a spatially weighted averaged chromaticity.

The device may include a substrate (i) having at least two conductive traces thereon and (ii) disposed proximate the bottom face of the light-emitting die. A contact pad may be disposed on the light-emitting die and may be electrically connected to a conductive trace on the substrate. The contact pad may be electrically connected to the conductive trace by (i) a wire bond, (ii) a solder joint, (iii) an anisotropic conductive adhesive, and/or (iv) a conductive adhesive. The substrate may include or consist essentially of a leadframe. The substrate may include or consist essentially of a rigid material selected from the group consisting of Si, SiC, AlN, AlON, sapphire, silicon oxide, SiAlON, SiCAlON, and alloys thereof (e.g., alloys including one or more thereof, with or without other materials). At least a portion of the light-emitting die and at least a portion of the substrate may be disposed in a package. The package may include or consist essentially of a plastic material and/or a ceramic material. The first type of wavelength-conversion particle may have a first density. The second type of wavelength-conversion particle may have a second density. The second density may be different from the first density. The first type of wavelength-conversion particle may have a first shape. The second type of wavelength-conversion particle may have a second shape. The second shape may be different from the first shape. The first type of wavelength-conversion particle may have a first radius (or other dimension such as a width or length). The second type of wavelength-conversion particle may have a second radius (or other dimension such as a width or length). The second radius (or other dimension such as a width or length) may be different from the first radius (or other dimension such as a width or length). The ratio of the first radius and the second radius may be defined by $$\frac{R_1}{R_2} = \sqrt{\frac{\rho_{p2} - \rho_f}{\rho_{p1} - \rho_f}},$$

where R1 is the first radius, R2 is the second radius, $\rho_{p1}$ is a density of the first type of wavelength-conversion particle, $\rho_{p2}$ is a density of the second type of wavelength-conversion particle, and $\rho_f$ is a pre-cured density of the binder (i.e., the density of the binder before curing).

In yet another aspect, embodiments of the invention feature a method of fabricating a light-emitting device including a bare light-emitting die having (i) a top face and a bottom face opposite the top face, the top and/or bottom face being configured for emission of light therefrom, and (ii) a sidewall spanning the top and bottom faces. A binder is applied over the die (e.g., over at least the top surface of the light-emitting die). Also applied over the die is a plurality of wavelength-conversion particles for absorbing at least a portion of light emitted from the light-emitting die and emitting converted light having a different wavelength. The plurality of wavelength-conversion particles includes or consists essentially of a first plurality of wavelength-conversion particles of a first type and a second plurality of wavelength-conversion particles of a second type different from the first type. A settling force is applied to the wavelength-conversion particles, whereby the wavelength-conversion particles form a spatial distribution in which, in at least a portion of the binder (or even throughout the binder), a concentration of the first plurality of wavelength-conversion particles relative to a total concentration of wavelength-conversion particles is within 20% of a concentration of the second plurality of wavelength-conversion particles relative to the total concentration of wavelength-conversion particles. The binder is at least partially cured to fix the spatial distribution of wavelength-conversion particles in the binder.

Embodiments of the invention include one or more of the following features in any of a variety of combinations. The converted light may be substantially white light. A divergence of color temperature of the substantially white light emitted from the light-emitting device may vary, over an angular range of 0° to 70°, no more than 0.01 (e.g., in terms of a Δu'v' deviation, where u' and v' are chromaticity coordinates on a chromaticity diagram) from a spatially weighted averaged chromaticity. The divergence of color temperature of the substantially white light emitted from the light-emitting device may vary, over an angular range of 0° to 80°, no more than 0.01 from a spatially weighted averaged chromaticity. The divergence of color temperature of the substantially white light emitted from the light-emitting device may vary, over an angular range of 10° to 75°, no more than 0.005 from a spatially weighted averaged chromaticity. At least a portion of the binder may extend laterally beyond the sidewall of the light-emitting die, and/or at least a portion of the binder may be disposed over the top face of the light-emitting die. The total concentration of the wavelength-conversion particles may vary in a direction substantially perpendicular to the top and/or bottom faces without varying radially toward or away from the light-emitting die. In at least a portion of the binder (or even throughout the binder), the concentration of the first plurality of wavelength-conversion particles relative to the total concentration of wavelength-conversion particles may be within 10%, or even within 5%, of the concentration of the second plurality of wavelength-conversion particles relative to the total concentration of wavelength-conversion particles.

The first plurality and/or the second plurality of the wavelength-conversion particles may be coated with one or more coating materials. The first plurality of the wavelength-conversion particles may be coated with a first coating material, and the second plurality of the wavelength-conversion particles may be coated with a second coating material different from the first coating material. The first and second pluralities of the wavelength-conversion particles may each be coated with different amounts of the same coating material. Once the first plurality and/or the second plurality of wavelength-conversion particles is coated, the first and second pluralities of wavelength-conversion particles may have approximately the same density.

The coating material may have a density greater than a density of the first type of wavelength-conversion particle. The first type of wavelength-conversion particle may have a first density, and the second type of wavelength-conversion particle may have a second density greater than the first density. The coating material may have a density less than a density of the first type of wavelength-conversion particle. The first type of wavelength-conversion particle may have a first density, and the second type of wavelength-conversion particle may have a second density less than the first density. The index of refraction of the coating material may be substantially equal to the index of refraction of the binder. The index of refraction of the coating material may be between (i) the index of refraction of wavelength-conversion particles of the first and/or second type, and (ii) the index of refraction of the binder. The coating material and the binder may include or consist essentially of the same material. The coating material and the binder may include or consist essentially of different materials. The total concentration of the wavelength-conversion particles may not vary radially toward or away from the light-emitting die within a plane parallel to the top and/or bottom faces of the light-emitting die. The first type of wavelength-conversion particle may emit light of a first color (e.g., yellow and/or green) when excited by blue or ultraviolet radiation. The second type of wavelength-conversion particle may emit light of a second color (e.g., red) when excited by blue or ultraviolet radiation, the second color being different from the first color.

The total concentration of the wavelength-conversion particles may increase in a direction extending from the top face of the light-emitting die to the bottom face of the light-emitting die. The total concentration of the wavelength-conversion particles may decrease in a direction extending from the top face of the light-emitting die to the bottom face of the light-emitting die. A portion of the binder may extend proximate the sidewall of the light-emitting die below a plane defined by the top face of the light-emitting die. A portion of the binder may be substantially free of wavelength-conversion particles. The light-emitting die may include or consist essentially of a light-emitting diode die. The light-emitting die may include or consist essentially of a GaN-based semiconductor material. The light-emitting die may emit blue light and/or ultraviolet light. The wavelength-conversion particles may include or consist essentially of phosphor particles. The phosphor particles may include or consist essentially of garnet and a rare-earth element.

The first and/or second pluralities of wavelength-conversion particles may be mixed into the binder before the binder is applied over the die. The first and/or second pluralities of wavelength-conversion particles may be applied over the die (e.g., mixed into the binder) after the at least a portion of the binder is applied over the die. At least a portion of the plurality of wavelength-conversion particles (e.g., all or part of the first plurality of wavelength-conversion particles and/or all or part of the second plurality of wavelength-conversion particles) may be applied over the light-emitting die before the binder is applied over the light-emitting die. The settling force may include or consist essentially of a neutral gravitational force (e.g., the wavelength-conversion particles may be allowed to settle in at least partially uncured binder under the force of gravity in a direction substantially perpendicular to the top and/or bottom face of the light-emitting die). The settling force may include or consist essentially of a non-neutral-gravity settling force. Applying the non-neutral-gravity settling force may include or consist essentially of tilting the die whereby gravitational force acts along a direction not perpendicular to the top or bottom faces of the light-emitting die. Applying the non-neutral-gravity settling force may include or consist essentially of rotating the light-emitting die (e.g., around a fixed axis and/or within a centrifuge). Applying the non-neutral-gravity settling force may include or consist essentially of applying an electric field across the binder. Applying the non-neutral-gravity settling force may include or consist essentially of applying acoustic energy to the binder. The acoustic energy may be applied to the binder as a standing wave, wavelength-conversion particles being repelled from peaks in the standing wave and attracted to troughs in the standing wave. The binder may be at least partially (or even substantially fully) cured while the settling force is applied.

The light-emitting die may be electrically and/or mechanically connected to a substrate disposed proximate the bottom face of the light-emitting die. A contact pad on the light-emitting die may be electrically connected to a conductive trace on the substrate. The contact pad may be electrically connected to the conductive trace by (i) a wire bond, (ii) a solder joint, (iii) an anisotropic conductive adhesive, and/or (iv) a conductive adhesive. The substrate may include or consist essentially of a leadframe. The substrate may include or consist essentially of a rigid material selected from the group consisting of Si, SiC, AlN, AlON, sapphire, silicon oxide, SiAlON, SiCAlON, and alloys thereof. At least a portion of the light-emitting die and at least a portion of the substrate may be disposed within a package. The package may include or consist essentially of a plastic material and/or a ceramic material. The first type of wavelength-conversion particle may have a first density, and the second type of wavelength-conversion particle may have a second density different from the first density. The first type of wavelength-conversion particle may have a first shape, and the second type of wavelength-conversion particle may have a second shape different from the first shape. The first type of wavelength-conversion particle may have a first radius, and the second type of wavelength-conversion particle may have a second radius different from the first radius. The ratio of the first radius and the second radius may be defined by $$\frac{R_1}{R_2} = \sqrt{\frac{\rho_{p2} - \rho_f}{\rho_{p1} - \rho_f}},$$

where R1 is the first radius, R2 is the second radius, $\rho_{p1}$ is a density of the first type of wavelength-conversion particle, $\rho_{p2}$ is a density of the second type of wavelength-conversion particle, and $\rho_f$ is a pre-cured density of the binder. The light-emitting die may be disposed on a substrate before the binder is applied over the light-emitting die. The substrate may be removed from the light-emitting die after at least partially curing the binder. The total concentration of the wavelength-conversion particles may vary substantially linearly in a portion or substantially all of the binder. The concentration of the first plurality of wavelength-conversion particles and/or the concentration of the second plurality of wavelength-conversion particles may vary substantially linearly in a portion or substantially all of the binder. The total concentration of the wavelength-conversion particles may vary substantially step-wise linearly in a portion or substantially all of the binder. The concentration of the first plurality of wavelength-conversion particles and/or the concentration of the second plurality of wavelength-conversion particles may vary substantially step-wise linearly in a portion or substantially all of the binder.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, and infrared radiation. Similarly, photometric terms such as "illuminance," "luminous flux," and "luminous intensity" extend to and include their radiometric equivalents, such as "irradiance," "radiant flux," and "radiant intensity." As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1A-1F are schematic illustrations of lighting systems in accordance with various embodiments of the invention;

FIGS. 2A-2H are schematic illustrations of lighting systems in accordance with various embodiments of the invention;

FIGS. 8A-8D are schematic illustrations of methods of manufacture of lighting systems in accordance with various embodiments of the invention;

FIGS. 9A-9C are schematic illustrations of methods of manufacture of lighting systems in accordance with various embodiments of the invention;

FIGS. 13A, 13B, 13C, 14A, and 14B illustrate methods of manufacture of lighting systems in accordance with various embodiments of the invention.

DETAILED DESCRIPTION

FIGS. 1A-1D depict exemplary illumination systems 100, 101, 102, and 103, respectively, in accordance with embodiments of the present invention, although alternative systems with similar functionality are also within the scope of the present invention. The illumination system may include a light-emitting element (LEE) 130 that emits electromagnetic radiation within a wavelength regime of interest, for example, visible blue light or radiation in the UV regime, when activated by passing a current through the device. LEE 130 may be at least partially covered by wavelength-conversion material 140 (also referred to herein as a phosphor), PCE, WCE or phosphor element (PE), all of which are utilized synonymously herein unless otherwise indicated.

Figure 1A:
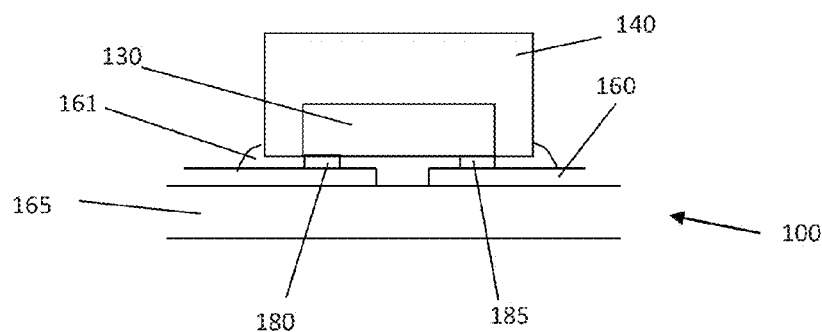
Figure 1B:
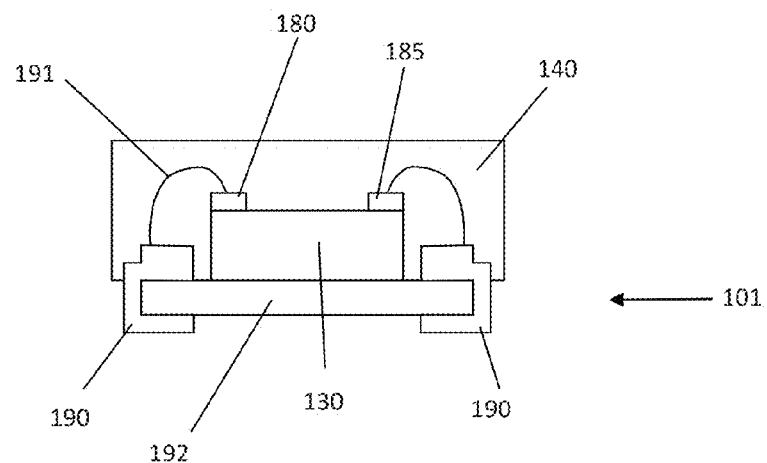
Figure 1C:
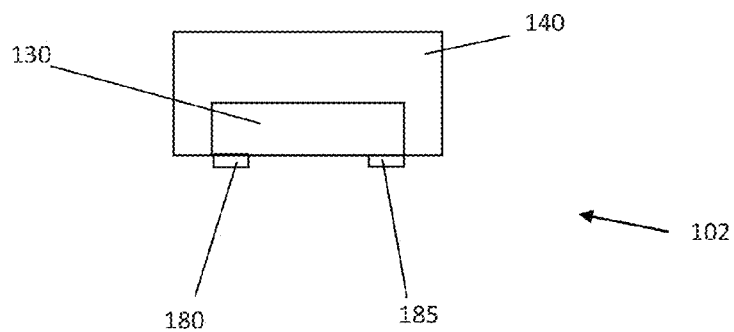

Each LEE 130 may be mounted on a leadframe (i.e., a package for LEEs that features external contacts (e.g., pins or wires) that are electrically connected, internal to the leadframe, to contact pads on the LEE), base, or substrate, as identified as 165 and 192 in FIGS. 1A and 1B respectively; however, this is not a limitation of the present invention and in other embodiments LEEs 130 within the scope of this invention may be unmounted or packaged, for example as shown in FIG. 1C. FIG. 1C shows an example of a white die 102 that includes or consists essentially of an LEE 130 and a phosphor 140.

In some embodiments of the present invention, contacts 180, 185 of LEE 130 may be electrically coupled and/or attached to conductive traces or conductive elements, as identified as 160 or 190 in FIGS. 1A and 1B respectively. Contacts 180, 185 of LEE 130 may be electrically coupled and/or attached to conductive traces 160 or 190 using a variety of means; the method of electrical coupling and/or attachment is not a limitation of the present invention. In some embodiments, contacts 180, 185 of LEE 130 may be electrically coupled and/or attached to conductive traces 160 or 190 using a conductive adhesive, a conductive paste, an anisotropic conductive film, or an anisotropic conductive adhesive (ACA), as shown in FIG. 1A. In some embodiments contacts 180, 185 of LEE 130 may be electrically coupled and/or attached to conductive traces 160 or 190 using wire bonds 191 as shown in FIG. 1B. In some embodiments LEE 130 may be attached to conductive traces 160 or 190 using a conductive adhesive and/or a non-conductive adhesive. In some embodiments contacts 180, 185 of LEE 130 may be electrically coupled and/or attached to conductive traces 160 or 190 using a solder process, eutectic solder process, wave solder process, or a solder reflow process. In some embodiments LEE 130 may be electrically coupled and/or attached to conductive traces 160 or 190 in a flip-chip orientation, for example as shown in FIGS. 1A and 1D. The method of electrical coupling and/or attachment of contacts 180, 185 to conductive traces 160 or 190 is not a limitation of the present invention.

The structures shown in FIGS. 1A-1C include one LEE 130; however, this is not a limitation of the present invention and in other embodiments the structure may include multiple LEEs 130, as shown in FIG. 1D. FIG. 1D shows a structure 103 that includes a substrate 192 over which have been formed conductive elements 160 and to which contacts 180 and 185 (not shown for clarity) of LEEs 130 have been electrically coupled. Contacts 180 and 185 may be attached using a variety of means, for example wire bonding, solder, adhesive, and the like. Exemplary structure 103 includes four LEEs 130; however, this is not a limitation of the present invention and in other embodiments structure 103 may include any number of LEEs 130, e.g., 10 or 20. Structure 103 also includes package contacts 191, 193 to which conductive elements 160 are electrically coupled and which are typically electrically connected to an external power source.

Substrates 165 and 192 may be composed of a wide range of materials. In some embodiments substrates 165 and 192 may have relatively low thermal conductivities. In some embodiments substrates 165 and 192 may have relatively high thermal conductivities. In some embodiments substrates 165 and 192 may be flexible, while in others they may be substantially rigid. Substrate 165 may include or consist essentially of a semicrystalline or amorphous material, e.g., polyethylene naphthalate (PEN), polyethylene terephthalate (PET), polycarbonate, polyethersulfone, polyester, polyimide, polyethylene, and/or paper. Substrate 165 may include or consist essentially of multiple layers, e.g., a deformable layer over a rigid material, for example, a semicrystalline or amorphous material, e.g., PEN, PET, polycarbonate, polyethersulfone, polyester, polyimide, polyethylene, and/or paper formed over a rigid substrate comprising, e.g., acrylic, aluminum, steel, and the like. Depending upon the desired application for which embodiments of the invention are utilized, substrate 165 may be substantially optically transparent, translucent, or opaque. For example, substrate 165 may exhibit a transmittance or a reflectivity greater than 65% for optical wavelengths ranging between approximately 400 nm and approximately 700 nm. In some embodiments substrate 165 may exhibit a transmittance or a reflectivity of greater than 65% for one or more wavelengths emitted by LEE 130 and or PCE 140. Substrate 165 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In some embodiments substrates 165 or 192 may include or consist essentially of materials such as fiberglass, FR4, ceramic materials such as silicon carbide, aluminum nitride, aluminum oxide, combinations of these materials, and the like. In some embodiments substrate 165 or 192 may include or consist essentially of a metal, for example a metal leadframe. The material and form of substrates 165 or 192 is not a limitation of the present invention.

Conductive elements 160 and 190 may be formed via conventional deposition, photolithography, and etching processes, plating processes, lamination, lamination and patterning, evaporation sputtering, chemical vapor deposition or the like or may be formed using a variety of printing processes. For example, conductive elements 160 and 190 may be formed via screen printing, flexographic printing, ink-jet printing, and/or gravure printing. The method of formation of conductive elements 160 and 190 is not a limitation of the present invention. Conductive elements 160 and 190 may include or consist essentially of a conductive ink, which may include one or more elements such as silver, gold, aluminum, chromium, copper, and/or carbon. Conductive elements 160 and 190 may include or consist essentially of a conductive material, which may include one or more elements such as silver, gold, aluminum, chromium, copper, and/or carbon. Conductive elements 160 and 190 may have a thickness in the range of about 50 nm to about 500 μm; however, the thickness of conductive elements 160 and 190 is not a limitation of the present invention. In some embodiments all or a portion of conductive elements 160 and 190 may be covered or encapsulated. In some embodiments a layer of material, for example insulating material, may be formed over all or a portion of conductive elements 160 and 190. Such a material may include or consist essentially of, for example, a sheet of material such as that used for substrate 165, a printed layer, for example using screen, ink jet, stencil or other printing techniques, a laminated layer, or the like. Such a layer may include or consist essentially of, for example, an ink, a plastic, a dielectric, an oxide, or the like. The covering material and/or the method by which it is applied is not a limitation of the present invention.

In one embodiment, conductive traces 160 may be formed so as to have a gap between adjacent conductive traces 160, and LEEs 130 are electrically coupled to conductive traces 160 using conductive adhesive, e.g., an isotropically conductive adhesive and/or an ACA, for example as shown in FIG. 1A. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs.

A wavelength-conversion material 140 is formed over all or a portion of LEE 130. The wavelength-conversion material may also be referred to as a phosphor or a PCE or PE. As used herein, wavelength-conversion material or phosphor refers to any material that shifts the wavelengths of light irradiating it and/or that is fluorescent and/or phosphorescent, is utilized interchangeably with the terms "light-conversion material" or "phosphor," and may refer to only a powder or particles or to the powder or particles with a binder. In some embodiments, the phosphor includes or consists essentially of a mixture of one or more wavelength-conversion materials and a matrix material. The wavelength-conversion material is incorporated to shift one or more wavelengths of at least a portion of the light emitted by the light emitter to other desired wavelengths (which are then emitted from the larger device alone or color-mixed with another portion of the original light emitted by the die). A wavelength-conversion material may include or consist essentially of phosphor powders, quantum dots or the like within a transparent matrix. In some embodiments, the matrix may be transparent or translucent. Phosphors are typically available in the form of powders or particles, and in such case may be mixed in binders, e.g., silicone. Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The phosphor may be a plurality of individual phosphors. The specific components and/or formulation of the phosphor and/or matrix material are not limitations of the present invention.

The binder may also be referred to as an encapsulant or a matrix material. In one embodiment, the binder includes or consists essentially of a transparent material, for example a silicone-based material or epoxy, having an index of refraction greater than 1.35. In one embodiment, the phosphor includes other materials, for example $SiO_2$, $Al_2O_3$, fumed silica or fumed alumina, to achieve other properties, for example to scatter light, to change the viscosity or to reduce settling of the powder in the binder. An example of the binder material includes materials from the ASP series of silicone phenyls manufactured by Shin Etsu, or the Sylgard series manufactured by Dow Corning. In some embodiments, the binder may be transparent to a wavelength of light emitted by the phosphor and/or by LEE 130.

The illumination system may include a clear or transparent encapsulant material that may contain scattering particles (e.g., titanium oxide, $TiO_2$) dispersed around LEE 130 to effectively scatter light. Additionally, a phosphor (e.g., a phosphor or fluorescent material) may be used for converting a portion of the LEE 130 emissions from one set of wavelengths to another.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a spread of wavelengths. An LEE may feature a phosphorescent or fluorescent material for converting a portion of its emissions from one set of wavelengths to another. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein "reflective" is defined as having a reflectivity greater than 65% for a wavelength of light emitted by the LEE on which the contacts are disposed. In some embodiments a LEE may comprise an electronic device or circuit or a passive device or circuit. In some embodiments a LEE may include or consist essentially of multiple devices, for example an LED and a Zener diode for static electricity protection. One or more non-LEE devices such as zener diodes, transient voltage suppressors (TVSs), varistors, etc., may be included to protect the LEEs 130 from damage which may be caused by high voltage events, such as electrostatic discharge (ESD) or lightning strikes.

In an exemplary embodiment, LEE 130 represents a light-emitting element such as an LED or a laser, but other embodiments of the invention feature one or more semiconductor dies with different or additional functionality, e.g., processors, sensors, detectors, control elements, and the like. Non-LEE dies may or may not be bonded as described herein, and may have contact geometries differing from those of the LEEs; moreover, they may or may not have semiconductor layers disposed over a substrate as discussed below. LEE 130 may be composed of one or more layers, for example semiconductor layers formed over a substrate. The substrate may, for example, include or consist essentially of one or more semiconductor materials, e.g., silicon, GaAs, InP, GaN, and may be doped or substantially undoped (e.g., not intentionally doped). In some embodiments, the substrate includes or consists essentially of sapphire or silicon carbide; however, the composition of the substrate is not a limitation of the present invention. The substrate may be substantially transparent to a wavelength of light emitted by the LEE 130. For a light-emitting element, the semiconductor layers may include first and second doped layers which preferably are doped with opposite polarities (i.e., one n-type doped and the other p-type doped). One or more light-emitting layers e.g., or one or more quantum wells, may be disposed between the first and second doped layers. Each of these layers may include or consist essentially of one or more semiconductor materials, e.g., silicon, InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, LEE 130 is an inorganic, rather than a polymeric or organic, device.

In some embodiments, substantially all or a portion the substrate is removed prior to or after the bonding of LEE 130 described below. Such removal may be performed by, e.g., chemical etching, laser lift-off, mechanical grinding and/or chemical-mechanical polishing or the like. In some embodiments, all or a portion of the substrate is removed and a second substrate—e.g., one that is transparent to or reflective of a wavelength of light emitted by LEE 130—is attached to the substrate or semiconductor layers prior to or after the bonding of LEE 130 as described below. In some embodiments, the substrate includes or consists essentially of silicon and all or a portion of the silicon substrate may be removed prior to or after the bonding of LEE 130 to a conductive element or other system. Such removal may be performed by, e.g., chemical etching, laser lift off, mechanical grinding and/or chemical-mechanical polishing or the like. In some embodiments, the silicon substrate may be partially removed or not removed.

Electrical contact to LEE 130 may be achieved through contacts 180 and 185, which may make contact to the p- and n-layers respectively. LEE 130 may optionally feature a mirror or reflective surface formed over all or portions of the semiconductor layers and optionally other portions of LEE 130. The mirror may act to direct light emitted from the light emitting layer back towards and out the substrate, particularly in a flip-chip configuration, where LEE 130 is mounted contact-side down.

In some embodiments, the LEE 130 has a square shape, while in other embodiments LEE 130 has a rectangular shape. In some preferred embodiments, to facilitate bonding) LEE 130 has a shape with a dimension in one direction that exceeds a dimension in an orthogonal direction (e.g., a rectangular shape), and has an aspect ratio of the orthogonal directions (length to width, in the case of a rectangular shape) of LEE 130 greater than about 1.2:1. In some embodiments, LEE 130 has an aspect ratio greater than about 2:1 or greater than 3:1. The shape and aspect ratio are not critical to the present invention, however, and LEE 130 may have any desired shape.

In different embodiments, LEEs 130 may have different sizes. In some embodiments, LEE 130 has one lateral dimension less than 500 μm. Exemplary sizes of semiconductor die 130 may include about 250 μm by about 600 μm, about 250 μm by about 400 μm, about 250 μm by about 300 μm, or about 225 μm by about 175 μm. In some embodiments, LEE 130 includes or consists essentially of a small LED die, also referred to as a "microLED." A microLED generally has one lateral dimension less than about 300 μm. In some embodiments, semiconductor die 300 has one lateral dimension less than about 200 μm or even less than about 100 μm. For example, a microLED may have a size of about 150 μm by about 100 μm or about 150 μm by about 50 μm. In some embodiments, the surface area of the top surface of a microLED is less than 50,000 μm$^2$ or less than 10,000 μm$^2$. In some embodiments, LEEs 130 may have one lateral dimension greater than 500 μm, or greater than 1000 μm, or greater than 2000 μm.

In some embodiments, an LEE 130 may include a white die comprising an LED that is integrated with a light-conversion material before being attached to a base or substrate. An exemplary schematic of a white die 102 is shown in FIG. 1C. The structure in FIG. 1C includes LEE die 130 (e.g., a "bare-die" or "unpackaged" LED die) that is partially covered or encased in light-conversion material 140. All or portions of contacts 180, 185 may be exposed to provide for electrical contact to die 130.

In some embodiments, white die 102 may be formed by forming light-conversion material 140 over and/or around one or more dies 130 and then separating this structure into individual white dies as described in U.S. Provisional Patent Application No. 61/589,908, the entirety of which is hereby incorporated by reference. FIGS. 1A-1D show light-conversion material 140 having a square or rectangular shape; however, this is not a limitation of the present invention and in other embodiments light-conversion material 140 has a hemispherical or substantially hemispherical shape, a parabolic or substantially parabolic shape, or any shape. In some embodiments, the shape and other properties of light-conversion material 140 are engineered to achieve specific optical characteristics, for example, light-distribution patterns. FIGS. 1A-1D show substantially the same thickness of light-conversion material 140 over the top and side walls of LEE 130; however, this is not a limitation of the present invention and in other embodiments, the thickness of light-conversion material 140 varies over different portions of die 130. White die 102 may be used to produce embodiments of this invention, instead of forming light-conversion material 140 over LEE 130 after attachment of LEE 130 to substrate 165. FIGS. 1A-1D show light-conversion material 140 having sidewalls that are perpendicular or substantially perpendicular to the top surface of light-conversion material 140; however, this is not a limitation of the present invention, and in other embodiments the sidewalls may form an obtuse or oblique angle with the top surface of light-conversion material 140.

FIG. 1E shows another embodiment of the present invention, a lighting system 104. Lighting system 104 features multiple LEEs 131, each of which may include or consist essentially of a light emitter or a phosphor-converted light emitter. Multiple LEEs 131 are formed on or attached to a base or fixture 194 (not shown in FIG. 1E or 1F are the LEE contacts and conductive traces and other required or optional lamp components, for clarity). As may be seen in FIG. 1E, a lighting system or luminaire in a basic form may include a fixture or housing 194 and multiple LEEs 131. Not shown in FIG. 1E or 1F is substrate 165. In some embodiments, lighting system 104 may include a distinct substrate 165 while in other embodiments LEEs 131 may be mounted on or over fixture 194. Lighting system 106 shown in FIG. 1F is similar to lighting system 104 shown in FIG. 1E, with the addition of an optic 132. As shown in FIG. 1F, optic 132 has one optical element associated with each LEE 131; however, this is not a limitation of the present invention and in other embodiments optic 132 may include a smooth or roughened surface or plate, or multiple LEEs 131 may be associated with each optical element, or multiple optical elements may be associated with each LEE 131.

FIGS. 2A-2H depict several embodiments of the present invention that feature an LEE 130 and an overlying PCE 140. In some embodiments, PCE 140 comprises one portion while in other embodiments PCE 140 comprises at least two different portions. These embodiments are not meant to be limiting to the invention, only to highlight various aspects of the invention. In some embodiments, a first portion 246 contains phosphor particles or powder, identified as a "phosphor," and a second portion 242 that does not contain phosphor particles or powder, identified as a "binder." In some embodiments, binder 242 may be transparent to a wavelength of light emitted by LEE 130. In some embodiments, binder 242 may have an index of refraction between about 1.35 and about 1.75.

As shown in FIGS. 2A-2H, a common aspect of some embodiments of the invention is that the phosphor layer 246 overhangs and/or wraps around the edges of LEE 130. As shown in FIG. 3A, if there is no overhang, light 310 exiting LEE 130 perpendicularly passes through binder 242 and phosphor 246 and may appear white. Light 320 exiting LEE 130 at a more shallow angle does not pass through phosphor 246 (it may or may not pass through binder 242) and appears relatively blue, leading to color temperature variations with viewing angle. As shown in FIG. 3B, the overhanging structure of phosphor 246 causes a larger solid angle of light emitted from LEE 130 to pass through phosphor 246, thus resulting in a relatively smaller color temperature variation with viewing angle. All of these examples include a non-phosphor-containing layer 242; however, this is not a limitation of the present invention, as shown for example in FIGS. 2G and 2H.

As shown in FIG. 3B, the extent of the solid angle of light emitted by LEE 130 that passes through phosphor 246 is at least partially dependent on the extent of overhang 330, the spacing 340 between the top of LEE 130 and the bottom of phosphor layer 246, the height 350 of LEE 130, and the thickness of phosphor layer 246. It also may depend on the emission pattern of LEE 130. If LEE 130 is engineered to have a non-Lambertian emission pattern or one that is substantially not Lambertian, then the extent of overhang 330 may be modified (e.g., reduced), and/or spacings 340 and/or 350 may be modified (e.g., increased).

LEE 130 may include a substrate over which the active device layers are formed. The structure and composition of such layers are well known to those skilled in the art. In general, such a layer structure (e.g., for an LED) may include top and bottom cladding layers, one doped n-type and one doped p-type, and one or more active layers (from which most or all of the light is emitted) in between the cladding layers. In some embodiments, the layers collectively may have a thickness in the range of about 0.25 µm to about 10 µm. In some embodiments, the substrate is transparent and all or a portion thereof is left attached to the device layers. In the case of nitride-based semiconductors (for example containing one more of the elements Al, Ga, In, and nitrogen) the substrate is often transparent, and may include or consist essentially of, e.g., sapphire, silicon carbide, GaN, or the like. In many embodiments, the substrates are at least initially thicker than the device layers, and may be subsequently thinned, for example to a thickness in the range of about 1 µm to about 25 µm, or may even be removed completely. As discussed above, reducing LEE 130 thickness 350 relaxes the need for a larger overhang distance 330. One way to reduce thickness 350 is to reduce the device layer thicknesses. Another way is to reduce the substrate thickness or completely or substantially completely remove the substrate after or during fabrication of LEE 130.

Figure 2C:
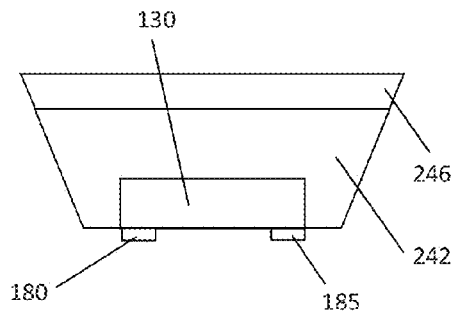
Figure 3A:
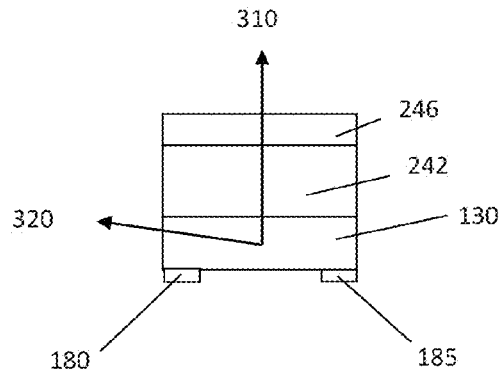
FIGS. 3A-3B are schematic illustrations of lighting systems in accordance with various embodiments of the invention.
Figure 3B:
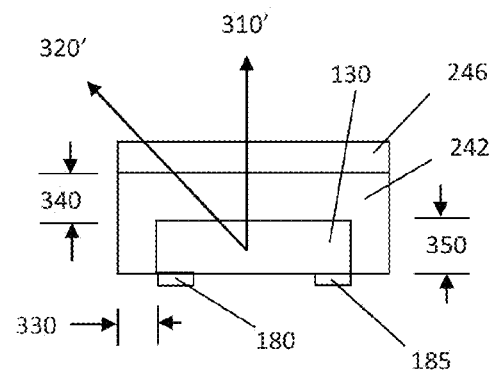
Figure 4A:
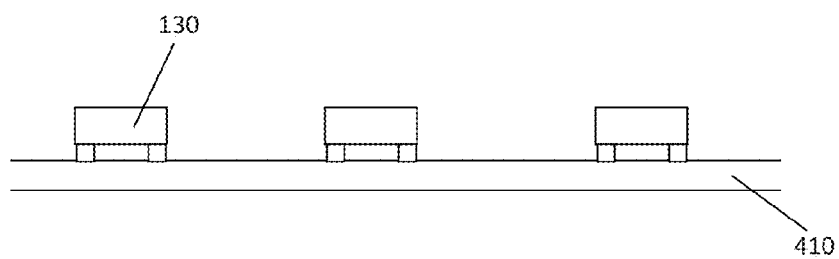
FIGS. 4A-4D are schematic illustrations of methods of manufacture of lighting systems in accordance with various embodiments of the invention.
Figure 4B:
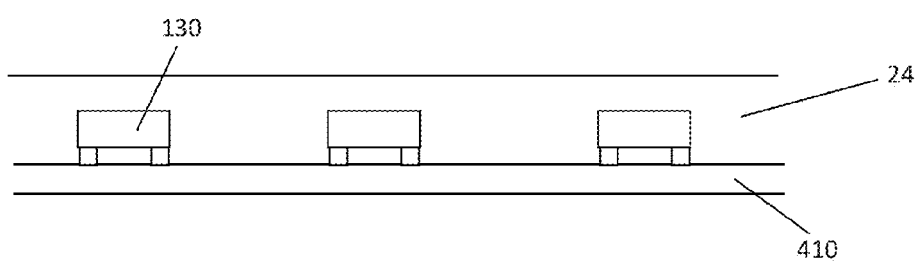

FIGS. 4A-4D illustrate one technique of manufacture for the structures shown in FIGS. 2A-2C. The process starts with formation of one or more LEEs 130 on a temporary "mold substrate" 410, as shown in FIG. 4A. This process is similar to that described in U.S. Provisional Patent Application No. 61/589,908, the entirety of which is incorporated by reference. In one embodiment, a layer of binder material 242 is formed over at least a portion of mold substrate 410 and at least some LEEs 130. FIG. 4B shows binder 242 having a height greater than height 350 of LEE 130, which may lead to a structure similar to that of FIG. 2A, but this is not a limitation of the present invention and in other embodiments binder 242 may have a height less than height 350 of LEE 130, which may lead to a structure similar to that of FIG. 2E, or may have the same as or substantially the same as height 350 of LEE 130, which may lead to a structure similar to that of FIG. 2B.

FIG. 4B shows the structure of FIG. 4A at a later stage of manufacture. In FIG. 4B, binder 242 has been formed over all or some LEEs 130 and mold substrate 410. Binder 242 may be formed in a variety of ways, for example casting, molding, lamination, and the like. In some embodiments, binder 242 may include or consist essentially of a silicone-based material, PDMS, epoxy, or the like. One example of a silicone-based binder is DOW OE-6652. After formation of binder 242, binder 242 may be cured, for example by application of heat, radiation, or the like. The top surface of binder 242 may be above the top surface of LEE 130, as shown in FIG. 4B, or it may be equal to or substantially equal the top surface of LEE 130, or it may be below the top surface of LEE 130.

Figure 4C:
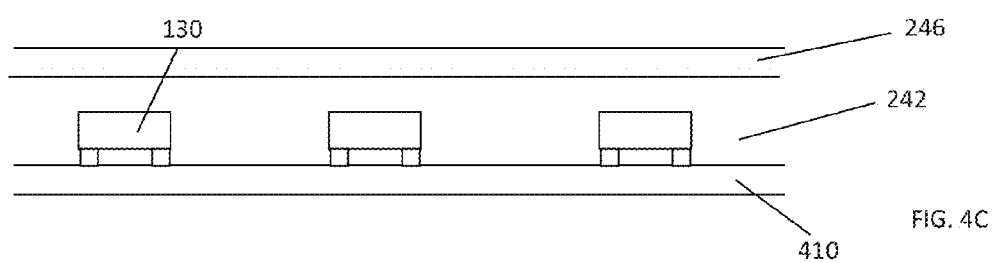

FIG. 4C shows the structure of FIG. 4B at a later stage of manufacture. In FIG. 4C, phosphor 246 has been formed over all or a portion of binder 242. In some embodiments, phosphor 246 may include or consist essentially of phosphor powders that are formed on or infused into a portion of binder 242. For example, phosphor powders may be formed or deposited on binder 242 at the stage shown in FIG. 4B, either before curing, after a partial cure, or after full curing. In other embodiments, phosphor powders are mixed with a binder, which may be the same or different from binder 246, and then formed over binder 246, as shown in FIG. 4C.

Figure 4D:
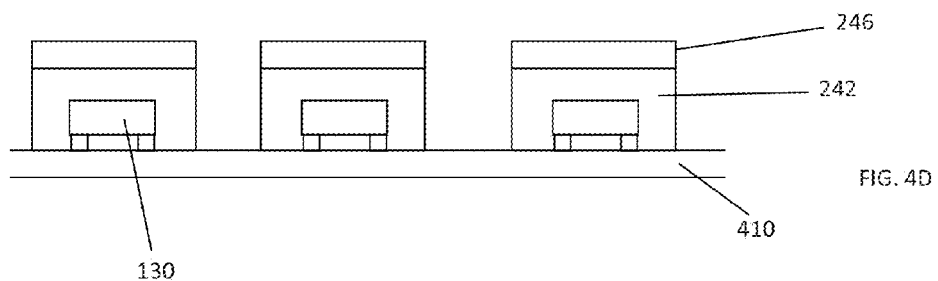

FIG. 4D shows the structure of FIG. 4C at a later stage of manufacture. In FIG. 4D, the structure of FIG. 4C has been singulated such that each portion includes one LEE 130, forming the structure of FIG. 2A, after removal from mold substrate 410. However, this is not a limitation of the present invention and in other embodiments each portion may include multiple LEEs 130. In the process described above, singulation, shown in FIG. 4D, is perpendicular to or substantially perpendicular to the top surface of LEE 130 and/or binder 242 and/or phosphor 246; however, this is not a limitation of the present invention and in other embodiments singulation may be performed at an angle to the perpendicular, forming either an acute or obtuse angle. For example, the structure in FIG. 2C may be formed using an angled singulation method. In other embodiments, angled sidewalls may be formed using a molding or casting method, as detailed subsequently. FIGS. 2A-2H show all sidewalls of phosphor 140 as being straight; however, this is not a limitation of the present invention, and in other embodiments the sidewalls of phosphor 140 may be curved or made up of multiple straight segments or have any shape.

Figure 2D:
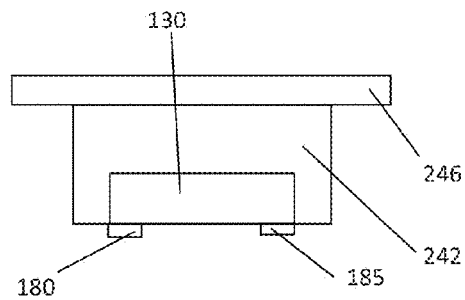
Figure 2E:
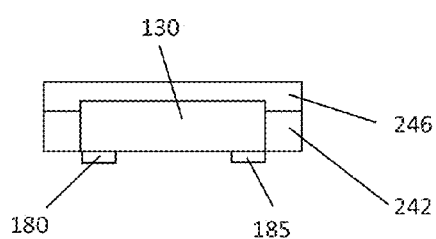
Figure 2F:
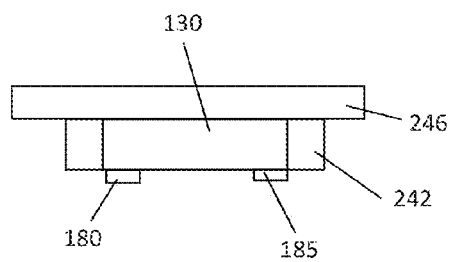
Figure 2G:
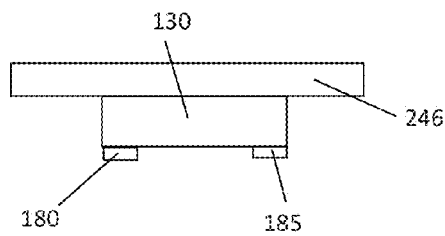
Figure 2H:
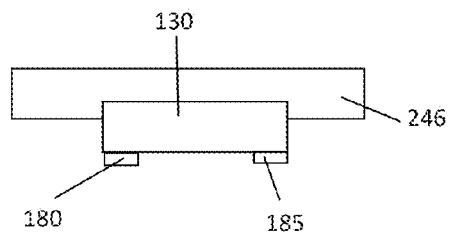
Figure 5A:
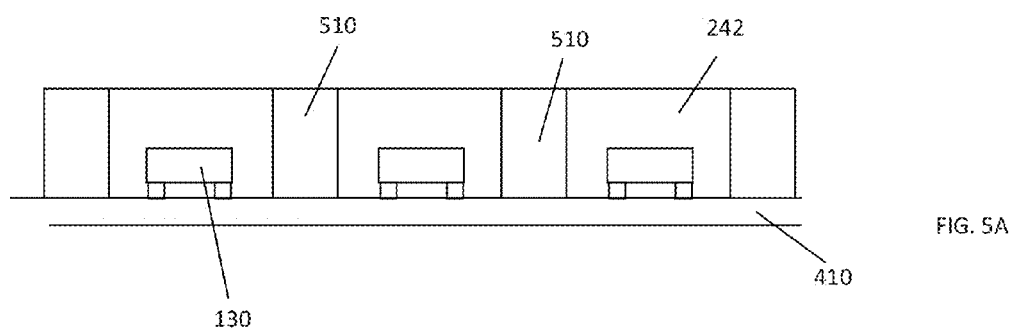
FIGS. 5A-5F are schematic illustrations of methods of manufacture of lighting systems in accordance with various embodiments of the invention.

The structure shown in FIGS. 2A-2H and similar structures may also be formed using a mold, as shown in FIG. 5A for the structure shown in FIG. 2D. The process starts with a structure like that shown in FIG. 5A. Around each LEE 130 a mold 510 is formed. Mold 510 may be formed on mold substrate 410 before or after formation of LEEs 130 on mold substrate 410. As shown in FIG. 5A, binder 242 is formed and optionally cured or partially cured in mold 510.

Figure 5B:
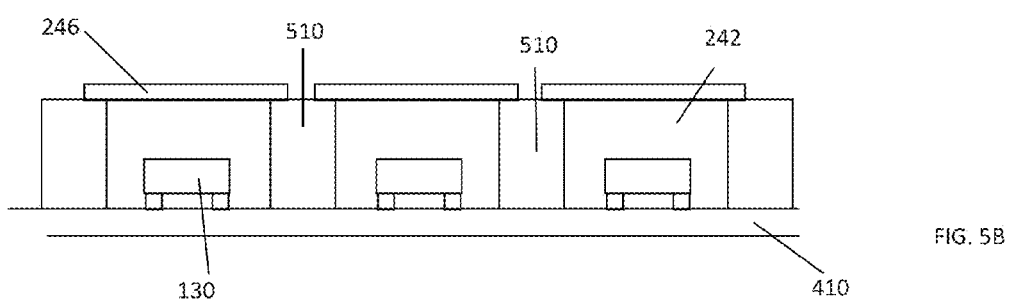
Figure 5C:
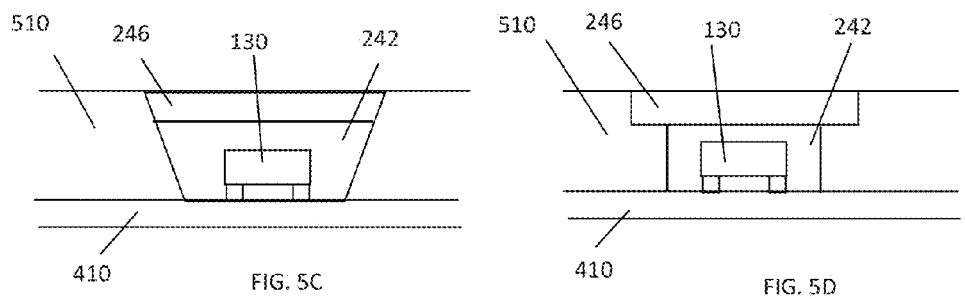
Figure 5D:
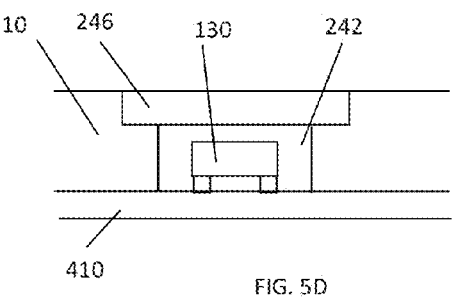
Figure 5E:
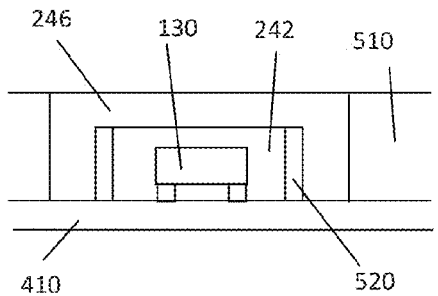
Figure 5F:
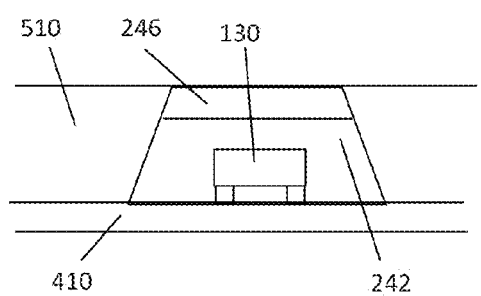

FIG. 5B shows the structure of FIG. 5A at a later stage of manufacture. In FIG. 5B, phosphor 246 has been formed over all or portions of binder 242 and mold 510, followed by curing and singulation of phosphor 246. Removal from mold 510 and mold substrate 410 results in the structure shown in FIG. 2D.

FIGS. 5C-5F show examples of other molds 510; however, the shape of mold 510 is not a limitation of the present invention, and in other embodiments other structures and shapes may be used for mold 510. The structures and description above include one binder layer 242 and one phosphor layer 246; however, this is not a limitation of the present invention, and in other embodiments more than one layer of each type may be present, or one type of layer may be absent. For example, in some embodiments binder 242 may be absent and the material surrounding or partially surrounding LED 130 may include or consist essentially of phosphor 246. In some embodiments, the material surrounding or partially surrounding LED 130 includes or consists essentially of multiple layers of phosphors 246. In some aspects of this embodiment, each of the layers may have a different concentration of phosphor particles. In some aspects of this embodiment, each of the layers may have a different composition or type of phosphor particles. In some aspects of this embodiment, each of the layers may have multiple different types of phosphor particles. In another embodiment, LEEs 130 may be temporarily attached to mold substrate 410 and flipped over and mated with mold 510 into which binder 242 and/or phosphor 246 were previously formed.

In some embodiments of the present invention, improved color temperature uniformity is achieved by varying the spatial concentration of the phosphor particles in the PCE. Methods for changing the phosphor concentration by using multiple layers, each of which has a different phosphor particle concentration, are discussed above. However, this invention is not limited to this technique for varying the concentration of phosphor particles in the PCE, and in other embodiments the phosphor concentration may be varied by other means, for example by using settling of the phosphor powders in the binder, by using differential curing of the binder and by other means. Various means for engineering the phosphor concentration will be discussed in detail subsequently.

Figure 6A:
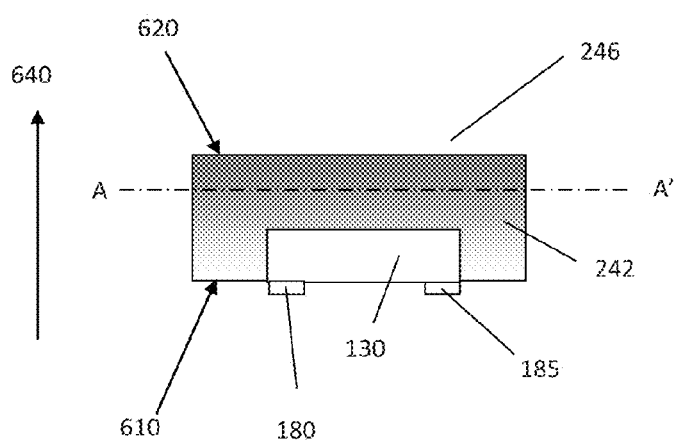
FIGS. 6A-6C are schematic illustrations of lighting systems in accordance with various embodiments of the invention.
Figure 6B:
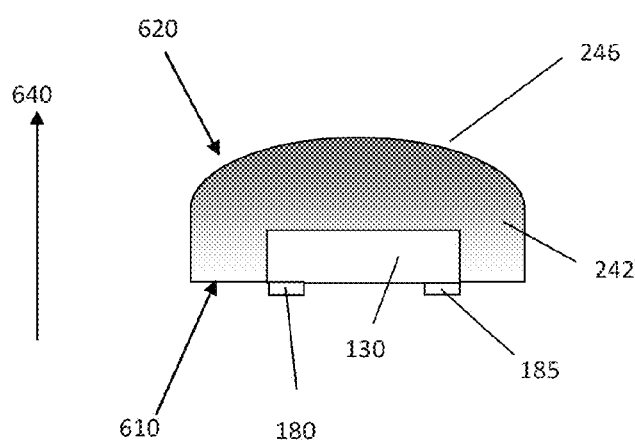
Figure 6C:
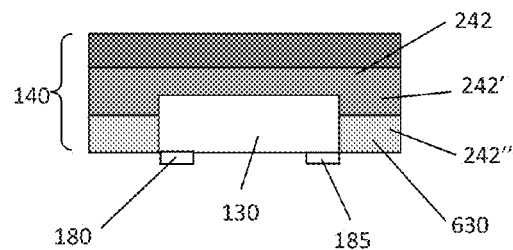

As discussed previously, the emission from a typical LED is Lambertian, while that from the PCE is typically isotropic. One aspect of embodiments of this invention is the engineering of the phosphor particle concentration within the PCE to make the intensity of light emitted by the PCE similar to, the same as, or substantially the same as that of the LED. In one embodiment of the present invention, this is achieved by engineering the concentration of phosphor particles such that there is a relatively lower concentration near the bottom compared to the top, as shown in FIGS. 6A-6C. FIGS. 6A and 6B show structures in which the concentration of phosphor particles varies within one phosphor layer or the entirety of PCE 140. In FIGS. 6A and 6B the variation in concentration of phosphor particles is represented by shading, where darker shading represents a higher concentration of phosphor particles. FIG. 6C shows a structure in which the concentration of phosphor particles 630 is varied by forming multiple phosphor layers 242, 242', and 242" within PCE 140. While the variation in concentration of phosphor particles in FIGS. 6A-6C is shown as larger at the top and smaller at the bottom, this is not a limitation of the present invention and in other embodiments the phosphor gradient may be reversed, or may be in any direction.

In some embodiments, the structure shown in FIG. 6C may be manufactured as discussed above, for example with reference to FIGS. 2A-5F. In some embodiments, settling of the phosphor particles in the binder may be employed to produce an engineered gradient in phosphor particle composition. Phosphor particles typically have a density in the range of about 2 gm/cm$^3$ to about 8 gm/cm$^3$, while the binders into which the phosphor particles are mixed, for example silicone binders, have a density in the range of about 0.5 gm/cm$^3$ to about 2 gm/cm$^3$. Because of the relatively significant difference in density between the phosphor particles and the binder, the phosphor particles will settle under the influence of gravity or another accelerating force. The rate of settling may be affected or controlled by a number of different parameters, for example the difference in density of the phosphor particles and binder, the viscosity of the binder, the acceleration force (relatively fixed for gravitational force on Earth), the radius of the phosphor particles, etc. Additional factors may also affect settling, for example temperature, which may change the binder viscosity. The binder viscosity may also be changed by use of additives, for example the phosphor particles or other additives such as fumed silica, fumed alumina, TiO$_2$, or the like. The settling direction may be varied by orienting the structure with respect to the gravitational (or other) applied force. Other forces may be applied to the structure to complement and/or counteract the force of gravity, for example by putting the structure in a centrifuge or other such system. Of course the gravitational force may also be changed by changing the elevation of the system above the Earth's surface or performing the fabrication in zero gravity (e.g., in outer space) or on another planetary body with a different gravitational force.

Stoke's law provides an expression for the settling velocity of a particle under the effect of gravity:

$$v_s = \frac{2}{9}\frac{(\rho_p - \rho_f)}{\mu}gR^2$$

where $v_s$ is the settling velocity, g is gravitational acceleration, $\rho_p$ is the mass density of the particle, $\rho_f$ is the mass density of the fluid, R is the radius of the particle, and $\mu$ is the dynamic viscosity of the fluid. While this equation assumes spherical, smooth and non-interacting particles, which may not be the case in all situations, it provides guidance for the use of settling to engineer a specific phosphor particle concentration gradient. As Stoke's law suggests, decreasing the fluid (binder) viscosity, increasing the difference in density between the particle and fluid (binder) and decreasing the particle radius will all result in an increased settling velocity. Since the viscosity generally decreases with increasing temperature, increasing the temperature, for example during the cure step, will also increase the settling velocity. Additives that modify the binder viscosity, for example, fumed silica, fumed alumina and/or $TiO_2$, to increase the viscosity, will reduce the settling velocity.

Figure 7A:
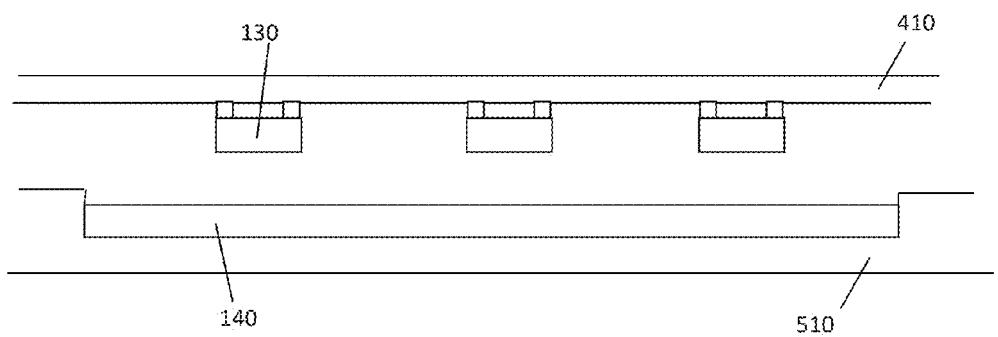
FIGS. 7A and 7B are schematic illustrations of methods of manufacture of lighting systems in accordance with various embodiments of the invention.
Figure 7B:
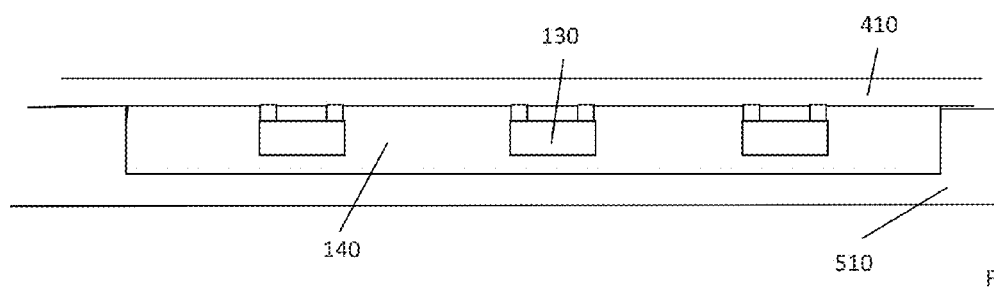

One method for manufacture of this embodiment of the invention starts with LEEs 130 formed on mold substrate 410, as shown in FIG. 7A. The phosphor particles are mixed with a binder to a desired concentration and this uncured mixture is put into a mold 510. The mold substrate 410 is oriented such that the LEEs 130 are facing down (i.e., toward the mold 510), as shown in FIG. 7A, and then is mated with mold 510, as shown in FIG. 7B. Instead of configuring the mixture of phosphor particles and binder, as well as the process conditions, to achieve a uniform or substantially uniform distribution of phosphor particles within the PCE, these variables are chosen to result in a specific desired distribution of phosphor particles within the PCE after completion of the process. In some embodiments, a wait period to allow phosphor particles 630 to settle in the binder is employed before mating, for example between the steps shown in FIG. 7A and FIG. 7B. In some embodiments, a wait period to allow phosphor particles 630 to settle in the binder is employed after mating, that is after the step shown in FIG. 7B. In some embodiments, settling takes place when the structure shown in FIG. 7B is heated before or during the process to cure the binder. In some embodiments, the structure shown in FIG. 7B may be subject to additional acceleration, for example in a centrifuge, to enhance settling. In some embodiments, particles with different densities or different radii or both may be used to control the settling rate. In some embodiments, a combination of these techniques may be used. In some embodiments, additives may be included in the binder to change the binder viscosity and thus the particle settling velocity. After curing of the binder, mold 510 or mold substrate 410 or both may be removed and the structure singulated to form the structure shown in FIG. 6A. Achievement of the desired phosphor concentration to achieve uniform or substantially uniform or improved color temperature uniformity with view angle may be achieved through simulation, experimentation, or a combination of both.

In some embodiments, the concentration of phosphor may increase monotonically from a first surface of PCE 140 to a second surface of PCE 140 opposite the first surface, for example from surface 620 to surface 610. In this embodiment, the phosphor concentration is relatively or substantially constant in a cut across PCE 140 in a direction parallel to the first or second surface of PCE 140, for example through line A'-A in FIG. 6A; however, this is not a limitation of the present invention, and in other embodiments the phosphor concentration may vary in a cut across PCE 140 in a direction parallel to the first or second surface of PCE 140, for example through line A'-A.

One aspect of embodiments of the present invention is that settling may be engineered to produce a monotonic as well as a non-monotonic phosphor gradient, and/or the phosphor gradient may be formed in a direction different than that shown by arrow 640 in FIGS. 6A and 6B. In some embodiments, settling may occur in multiple different directions, for example to form phosphor gradients in multiple directions. In some embodiments, settling may be driven by gravitational and/or centrifugal force. In some embodiments, settling may be driven by other applied forces in combination with a gravitational force or by other applied forces alone. In some embodiments, the resulting phosphor layer may have a smooth or substantially smooth gradient in phosphor particle concentration in one or more directions. In some embodiments, a smooth gradient may be defined as no step (i.e., abrupt) change in phosphor concentration in PCE 140 larger than 10% of the maximum phosphor particle concentration along the gradient. In some embodiments, a smooth gradient may be defined as no step change in phosphor concentration in PCE 140 larger than 5% of the maximum phosphor particle concentration along the gradient. In some embodiments, a smooth gradient may be defined as no step change in phosphor concentration in PCE 140 larger than 1% of the maximum phosphor particle concentration. In some embodiments, the structure may feature a step-graded structure.

In another embodiment, differential or selective curing is utilized to create different structures. For example, a heating plate (or other heat source) may be applied to one side of mold 510 or mold substrate 410 to selectively cure a layer of the phosphor near the heating plate. This may be used to "freeze" some particles in place earlier than others, or may be used to reduce the viscosity of the binder near the heating plate or both.

Figure 8A:
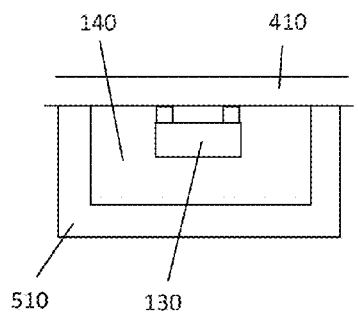
Figure 8B:
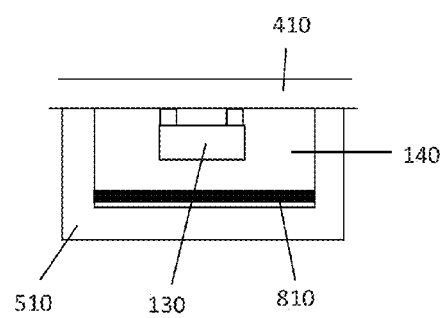

In another embodiment, the process in the previous paragraph may only be partially carried out, that is the binder only partially cured. Upon removal of the heating plate after the initial partial cure, the orientation of the mold may be optionally changed. The phosphor particles may settle in a different orientation and then the binder fully cured. This procedure may be repeated many times until a desired layer structure is created, as depicted in FIGS. 8A-8D. FIG. 8A shows an LEE 130 on mold substrate 410 that is mated with mold 510 filled with uncured phosphor 140. FIG. 8B shows the structure of FIG. 8A at a later stage of manufacture, after partial settling of the phosphor particles, producing a layer of relatively higher concentration phosphor particles at the bottom of mold 510 and partial curing of the phosphor to lock in or freeze this locally higher phosphor particle concentration, identified as 810. The structure is then turned over, as shown in FIG. 8C, and the remaining phosphor particles not in the cured binder are allowed to settle again (in a different direction than the previous partial cure) and the binder fully cured, producing two locally higher phosphor particle concentrations, identified as 810 and 820. The phosphor particle concentration in region 810 may be greater or less than that in region or layer

820. After removal from mold 510 and mold substrate 410 and optional singulation, the structure is as shown in FIG. 8D. The structure in FIG. 8D shows layers 810 and 820 having a higher phosphor particle concentration than the region between layers 810 and 820; however, this is not a limitation of the present invention and in other embodiments, the structure may have more or fewer layers or regions with different phosphor particle concentrations. The process shown in FIGS. 8A-8D features one LEE 130 in mold 510; however, this is not a limitation of the present invention and in other embodiments mold 510 may contain multiple LEEs 130, as shown for example in FIG. 7B. The structure shown in FIG. 8D shows three regions of different phosphor concentrations; however, this is not a limitation of the present invention and in other embodiments the structure may have two regions or more than three regions of different phosphor concentration.

In some embodiments, the phosphor particle concentration may vary monotonically from one side of the LEE or PCE to the other, while in other embodiments the phosphor particle concentration may increase and decrease with respect to the LEE or PCE. In some embodiments, the phosphor particle concentration within one region or layer (for example 810 or 820 in FIG. 8D) may be relatively or substantially homogeneous, while in other embodiments the phosphor particle concentration within one region or layer may vary. The structures discussed above and shown in the above figures (for example FIGS. 2A-2H, 3A, 3B, 4D, 6A-6C, and 8D) show the phosphor particle concentration varying only in the direction perpendicular to the face comprising the LEE contacts (identified as 610 in FIG. 6A); however, this is not a limitation of the present invention, and in other embodiments the phosphor particle concentration may be varied in other directions or in multiple directions.

FIG. 9A shows an example of a structure in which the phosphor particle concentration varies in a different direction than that perpendicular to the face comprising the LED contacts (identified as 610 in FIG. 6A). As may be seen in FIG. 9A, the phosphor particle concentration is highest in the upper left and upper right hand corners of PCE 140, and the concentration of phosphor particles between the upper right and upper left hand corners is greater than that at the lower portion of PCE 140.

In one embodiment, FIG. 9B shows the structure of FIG. 9A at an early stage of manufacture. Mold 510 contains LEE 130 and uncured phosphor 140. Before full or partial curing of phosphor 140, the mold 510 is tilted, as shown in FIG. 9B. The binder is partially cured, for example by the application of differential heat or UV radiation and then mold 510 is tilted the opposite direction, as shown in FIG. 9C, after which the cure is completed. After removal from mold 510 and mold substrate 410 and singulation, if necessary, the structure of FIG. 9A is formed.

In another embodiment, the structure of FIG. 9A may be subject to a force different from that of gravity (for example in a centrifuge or manufacture in low- or zero-gravity environments such as outer space), or one or more forces in addition to that of gravity. For example, instead of or in addition to tilting, the structure of FIG. 9B may be placed in a centrifuge to modify the direction of the dominant force on the structure (which depends on its orientation with respect to the axis of rotation of the centrifuge). Such an approach may be used to make structures with a monotonic, non-monotonic, or arbitrary phosphor concentration distribution within PCE 140.

In one embodiment, the phosphor and binder mixture are formed in the mold or structure and the phosphor is allowed to settle under an applied force, for example nominal Earth gravity. In another embodiment, during the settling time one or more other characteristics may be modified, for example temperature and/or the gravitational force.

In another embodiment, separate phosphor mixtures and binders may be applied sequentially to the LEE die and cured simultaneously, while in another embodiment the layers are applied sequentially and cured or partially cured after each layer application. In one embodiment, a waiting period is included between each mixture application, or between a mixture application and cure or partial cure, to allow some degrees of settling and/or intermixing of the phosphor particles. Such an approach may be used, for example with the structures shown in FIGS. 4A-4D and 5A-5F, with or without advanced mold structures (such as that in FIG. 5E comprising a plurality of mold components identified as 510 and 520) to produce PCEs having monotonic, non-monotonic or arbitrary phosphor concentration distributions and shapes within the PCE.

While some of the discussions and figures show only one LEE and one mold, or one LEE within one mold, this is not a limitation of the present invention and in other embodiments these techniques may be used to produce multiple phosphor-integrated structures or white dies simultaneously. One preferable aspect of this invention is the use of these techniques to produce very large numbers of phosphor-integrated structures or white dies simultaneously, using batch-type processing at low cost with desirable optical characteristics and performance.

In some embodiments, the curing is performed by applying microwave heating; this produces a different thermal profile in an initial stage of cooling, thus allowing a different profile of the phosphor layer. For example, in some embodiments upon applying the microwave radiation, the phosphor mixture closest to the LEE die is cured first with one phosphor concentration. The microwave radiation may then be removed before complete curing of the phosphor mixture, after which curing is completed. Upon cooling, settling of the phosphor particles occurs, forming a phosphor density profile around the cured layer, as illustrated in FIG. 10C.

Figure 10A:
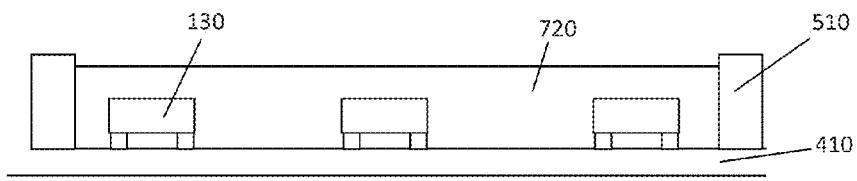
FIGS. 10A, 10B, and 10D are schematic illustrations of methods of manufacture of lighting systems in accordance with various embodiments of the invention.
Figure 10B:
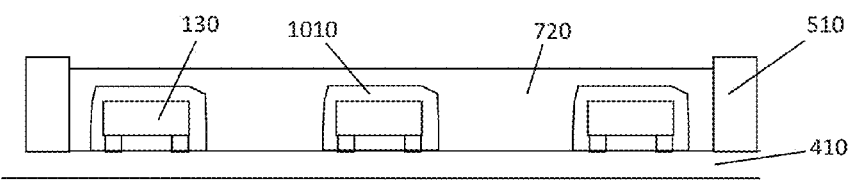
Figure 10C:
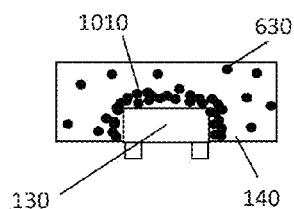
FIGS. 10C and 10E are schematic illustrations of lighting systems in accordance with various embodiments of the invention.
Figure 10D:
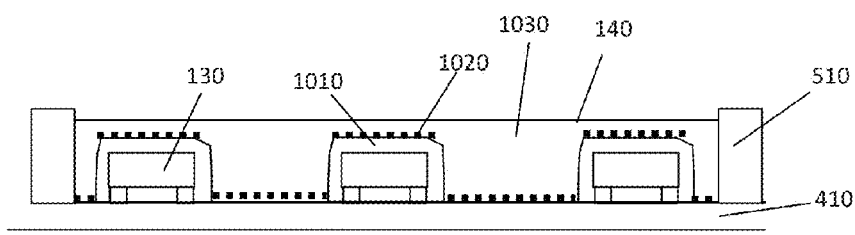
Figure 10E:
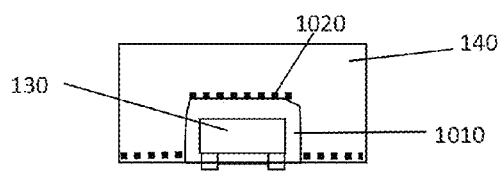

FIG. 10A shows one possible starting point for the manufacture of the structure shown in FIG. 10C. In the structure shown in FIG. 10A, LEEs 130 are formed on mold substrate 410. Mold 510 is used to hold and form phosphor 140. FIG. 10B shows the structure of FIG. 10A at a later stage of manufacture. In FIG. 10B, radiation, for example microwave radiation, has been applied in such a way to selectively or preferentially heat the region of phosphor 140 surrounding or adjacent to each LEE 130. The material surrounding or adjacent to LEEs 130 may cure or partially cure, forming a first phosphor region 1010. At this point the structure may be then fully cured, removed from mold 410 and mold substrate 510 and optionally singulated, resulting in the structure shown in FIG. 10C (in FIG. 10C phosphor region 1010 is represented by a plurality of phosphor particles 630). In another embodiment, the structure of FIG. 10B is subjected to a wait time, to permit additional phosphor particles to settle, as shown in FIG. 10D. In FIG. 10D, phosphor 140 now comprises three regions, i.e., phosphor 1030 and regions 1010 and 1020, where regions 1010 and 1020 have a relatively higher phosphor particle concentration than the regions outside of regions 1010 and 1020, e.g., region 1030. The structure shown in FIG. 10D may then be cured, removed from mold substrate 410 and mold 510 and optionally singulated, resulting in the structure shown in FIG. 10E.

Figure 11A:
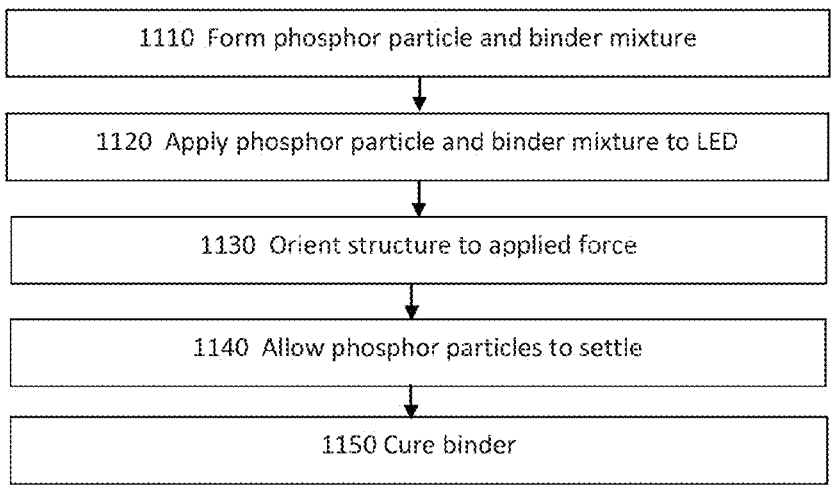
FIGS. 11A and 11B are process flows showing methods of manufacture of lighting systems in accordance with various embodiments of the invention.
Figure 11B:
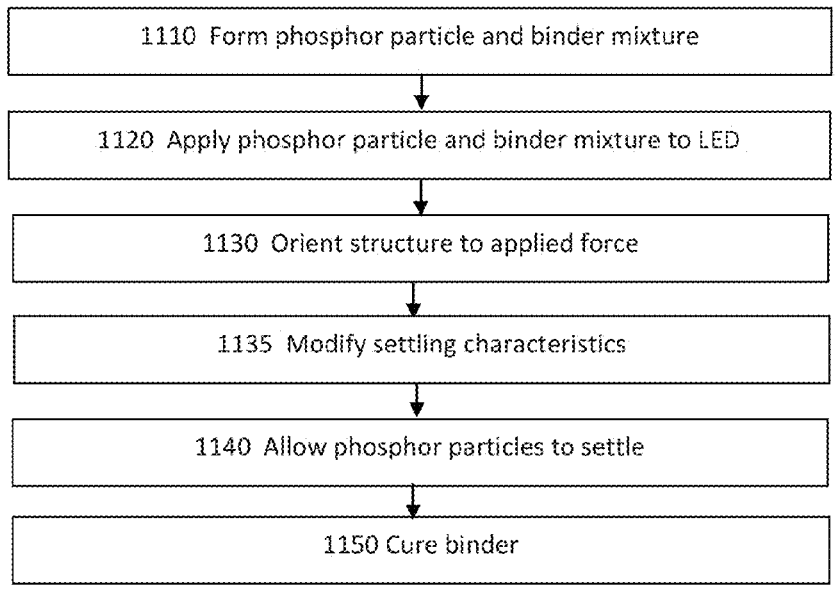

FIG. 11A is a flow chart of one embodiment of the present invention. In step 1110 the phosphor particles and binder are mixed. In step 1120 the phosphor particle and binder mixture is applied to the LEE. In step 1130 the structure is oriented to the applied force, for example gravitational force, to set the settling direction. In step 1140 the phosphor particles are allowed to settle. In step 1150 the binder is cured. FIG. 11B shows another embodiment, employing a step to modify the settling characteristics, for example by heating the binder to a temperature high enough to reduce its viscosity from that of ambient conditions, but not high enough to fully cure the binder. As shown in FIG. 11B, the process starts with step 1110, mixing of the phosphor particles and binder. In step 110 the phosphor particle and binder mixture is applied to the LEE. In step 1130 the structure is oriented to the applied force, for example gravitational force, to set the settling direction. In step 1135 the settling characteristics are modified. In step 1140 the phosphor particles are allowed to settle. In step 1150 the binder is cured. In some embodiments, the phosphor particles and binder are applied to the LED in a mold or other confining structure. In some embodiments, the LEE is actually multiple LEEs. In some embodiments, an optional partial cure of the binder may take place, for example before steps 1110, 1120, 1130 or 1140. In some embodiments, the steps may be performed in a different order, or some steps may be added, or some steps may be removed. For example, an optional step may include singulation after step 1150 (curing of the binder). In some embodiments, one or more steps may be repeated. In some embodiments, step 1130 may be modified to replace the Earth's gravitational force or to modify the Earth's gravitational force (including both direction and/or magnitude) with a replacement or supplemental force, for example a force supplied using a centrifuge.

Figure 12A:
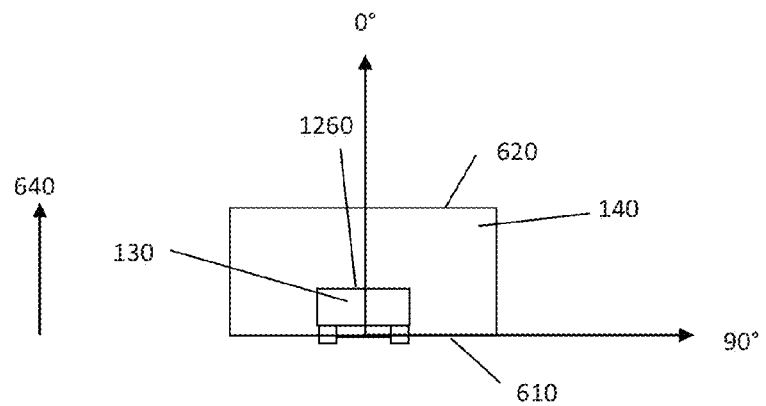
FIG. 12A is a schematic illustration of a lighting system in accordance with various embodiments of the invention.
Figure 12B:
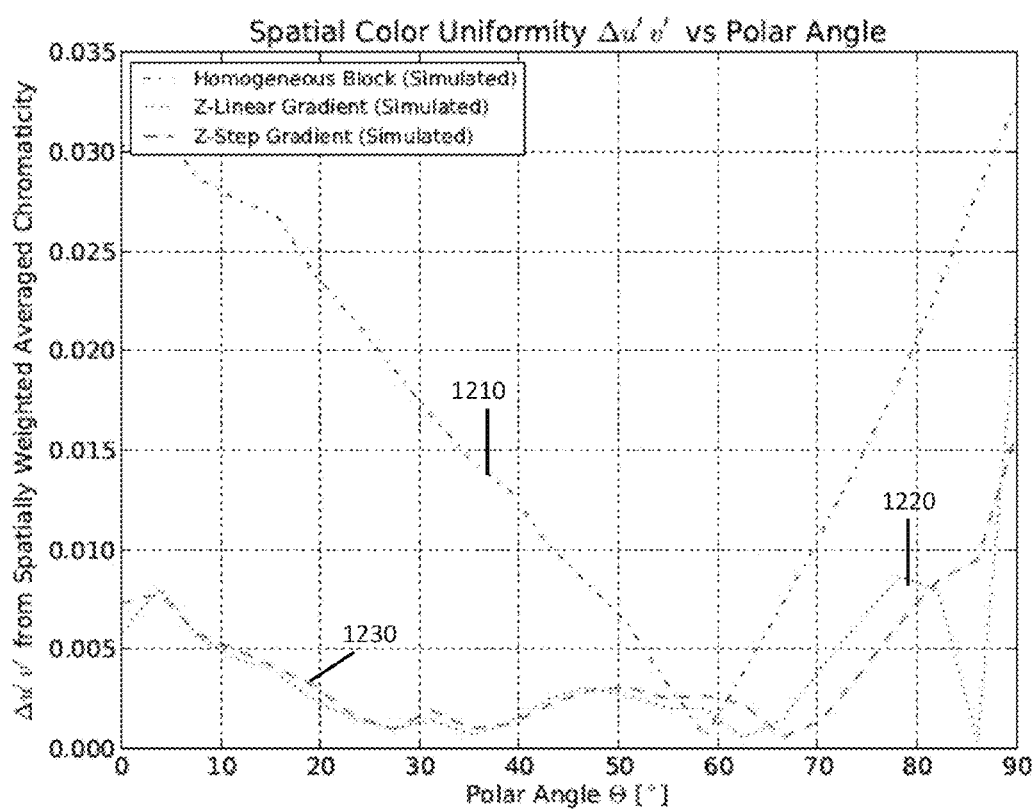
FIG. 12B is a plot of color characteristics as a function of polar angle in accordance with various embodiments of the invention.

FIG. 12B shows simulations of the divergence of color temperature in terms of the $\Delta u'v'$ deviation from the spatially weighted averaged chromaticity (0° polar angle is looking directly down on the structure shown in FIG. 12A) as a function of angle for the structure of FIG. 12A with three different phosphor gradient structures. The variables u' and v' are chromaticity coordinates on the CIE 1976 chromaticity diagram. FIG. 12B shows the deviation of the u'v' color points (i.e., the $\Delta u'v'$ or u'v' deviation) as a function of angle from that of the spatially weighted average chromaticity. In other words, the average chromaticity over all angles (for example as measured in an integrating sphere) is first determined, and then the deviation of the chromaticity at each angle in units of u'v' color coordinates is determined. FIG. 12B shows that deviation plotted as a function of angle. In FIG. 12B, line 1210 represents the case where phosphor 140 is homogeneous, line 1220 where phosphor 140 is linearly graded from the top (surface 620) to the bottom (surface 610) of phosphor 140 (similar to that shown in FIG. 6A) and line 1230 where phosphor 140 is step-graded with 10 equally spaced steps from the top (surface 620) to the bottom (surface 610) of phosphor 140 (similar to that shown in FIG. 6C, but with 10 equally spaced steps). As may be seen, the color variation (as measured by $\Delta u'v'$) as a function of angle is much lower for the two graded structures than for the homogeneous structure, except for the value at 60°, which represents the spatially weighted average chromaticity (i.e., the average chromaticity value over the entire angular range). The chromaticity deviates significantly at both low and high polar angles for the homogeneous phosphor distribution, but is significantly more uniform for both of the graded structures across the entire polar angle range. There is a relatively small divergence in chromaticity at the highest polar angles for the graded structures; however, in many embodiments there is relatively little optical power at such high polar angles and because of this the divergence in color temperature at these very large polar angles is frequently not an issue. In some embodiments, the rate of grading may be constant, for example in the linearly graded example discussed herein; however, this is not a limitation of the present invention, and in other embodiments the rate of grading may change through the thickness of the phosphor. In one embodiment, the rate of grading may be changed, for example to provide relatively smaller color temperature variations with angle than may be achieved with a constant rate of grading. In one embodiment, the rate of grading near the top and/or bottom of the phosphor may be changed (i.e., increased or decreased) to further reduce the color temperature variation at the higher and lower polar angles, for example in the range of angles of about 0° to about 15° and/or about 75° to about 90°. In some embodiments, as shown above, the gradient is in the direction perpendicular to an emitting face 1260 (i.e., the face of the die from which all or a substantial fraction of light is emitted) of LEE 130 and not in a radial direction toward or away from LEE 130.

In addition to settling, other methods may be used to produce engineered gradients of phosphor particles within such structures. In some embodiments, some or all of the phosphor particles may be coated or partially coated with organic ligands. The organic ligands may be designed to repel each other, thus promoting a more uniform distribution in the final phosphor structure. In some embodiments, more than one type of phosphor particle may be used, and each type of phosphor particle coated or partially coated with a different organic ligand. The organic ligands may be designed such that a first organic ligand repels another first organic ligand, but a first organic ligand attracts a second organic ligand. In this case, a first type of phosphor particle may be attracted to a second type of phosphor particle but adjacent first or second types of phosphor particles repel each other. In some embodiments, this may promote phosphor uniformity without relying on fumed alumina or silica to prevent phosphor particle clumping.

In some embodiments, the organic ligand may be engineered to be attracted to or repelled by the LEE or one or more materials thereof, or if used, the material of the mold, thus providing another method for engineering a phosphor particle profile. In some embodiments, the mold may be coated with a material that attracts or repels the organic ligand of the phosphor particle.

In some embodiments, the phosphor particles may be charged while in solution in the uncured binder or its precursors. In this case the phosphor particle distribution may be modified by placing the system in an electric field oriented in the desired direction to produce a desired distribution. FIG. 13A is a schematic of such a process in which phosphor particles 630 have a negative charge and experience a force in the direction of the positive end of an electric field. The direction and strength of the electric field, as well as the viscosity of the binder and the particle size and charge, may be modified to control the drift of the phosphor particles in the electric field. The binder may then be cured or cured in stages with the electric field on or off to freeze in the desired phosphor particle profile. In some embodiments, the process may be repeated with different electric field directions, partial cures of the binder, or changes in other properties to achieve a specific monotonic or multi-directional phosphor particle profile. In some embodiments, an electric field may be generated by situating the system between two or more conductive elements 1310, where at least two of the conductive elements have an opposite charge, as shown in FIG. 13B. In some embodiments, an electric field may be generated by application of a potential 1320 between two conductive elements 1310. In some embodiments, the potential may be a DC voltage. In some embodiments, the potential may be an AC voltage. In some embodiments, the conductive elements may include or consist essentially of, for example, plates or needles. In some embodiments, the shape of one or more conductive plates may be used to modify the electric field pattern and thus induce a phosphor profile that is the same as or similar to the electric field profile, as shown in FIG. 13C. FIG. 13C shows one flat conductive element or electrode 1310 and one relatively smaller, pointed electrode or conductive element 1330 that collectively form a modified electric field, as shown by dotted lines 1340. In some embodiments, the electric field may vary with time during the process or during the cure process. In some embodiments, charging of the phosphor particles may be accomplished by coating or partially coating the phosphor particles with organic ligands that may be made to accept a charge. In some embodiments, charging of the phosphor particles may be accomplished by triboelectricity (otherwise known as static electricity). In some embodiments, the phosphor particles may be charged by exposure to light or other radiation.

Figure 14A:
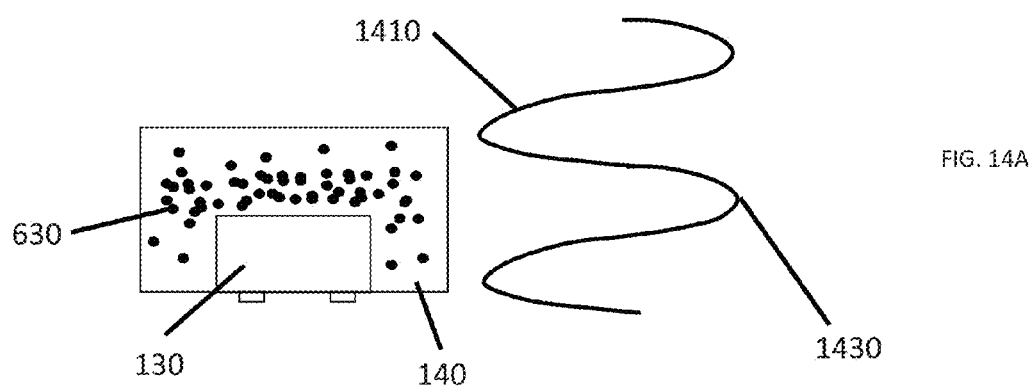
Figure 14B:
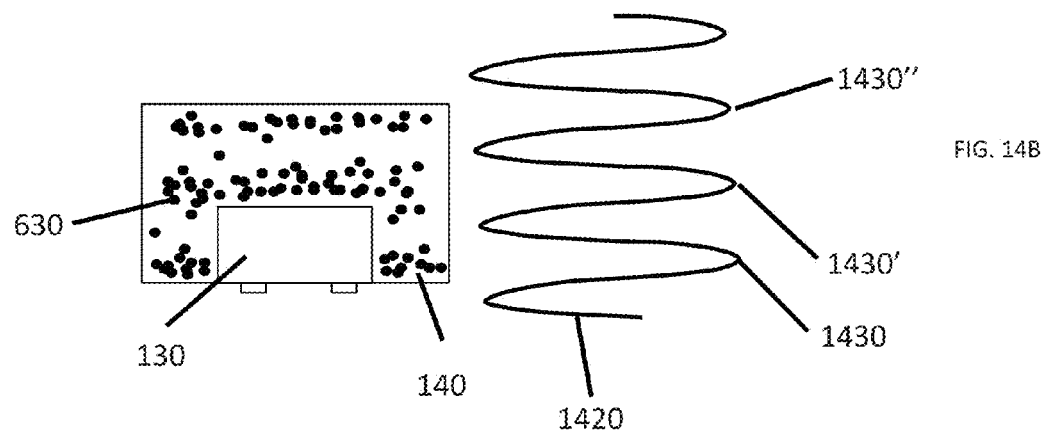

In some embodiments, standing acoustic waves may be generated within the phosphor/binder volume, which may provide a driving force for migration of the phosphor particles towards the standing wave troughs. This may be used to create a monotonic or periodic phosphor particle distribution, as shown in FIGS. 14A and 14B. FIG. 14A shows an embodiment in which a standing acoustic wave 1410 has a crest 1430 within the volume of phosphor 140, creating a region relatively in the middle of phosphor 140 having a high phosphor particle 630 concentration. FIG. 14B shows an embodiment in which standing acoustic wave 1410 has three crests 1430, 1430' and 1430" within the volume of phosphor 140, creating three regions of phosphor 140 having a high phosphor particle 630 concentrations. In some embodiments, the standing acoustic wave is generated using an ultrasonic transducer disposed proximate or in contact with the LEE and/or mold. In some embodiments, two-dimensional standing waves may be generated, permitting the manufacture of phosphor particle distributions that vary in multiple directions. While the example above shows the crest of standing acoustic wave 1410 corresponding to a region of phosphor 140 having a relatively high phosphor particle 630 concentration, this is not a limitation of the present invention, and in other embodiments the crest of standing acoustic wave 1410 may correspond to a region of phosphor 140 having a relatively low phosphor particle 630 concentration.

In some embodiments, it may be desirable to use more than one type of phosphor (e.g., multiple types of phosphor particles) to achieve the desired optical properties. For example, in one embodiment a yellow-emitting phosphor may be combined with a red-emitting phosphor to achieve a desired color temperature and/or color rendering index (CRI). In some embodiments, more than two different types of phosphors may be utilized.

In some embodiments, it may be desirable to keep the relative concentrations of each of the different types of phosphor substantially the same within the structure, even when the total phosphor particle concentration varies as a function of position. That is, at a first position within the binder, the total phosphor particle concentration may be different from that at a second position within the binder; however, the relative concentrations of the different phosphor types (i.e., the concentration of each phosphor type compared to the total phosphor particle concentration) may be substantially the same at the first and second positions.

In some embodiments, the different types of phosphors may have different shapes, sizes, and/or densities. These different physical characteristics may result in different settling rates. Furthermore, chemical differences between different types of phosphor particles may also result in different settling rates. These effects may result, in some embodiments, in an undesirable variation in the relative local concentrations of the different phosphor types at different positions within the structure. Table 1 below shows properties of a yellow/green phosphor and a red phosphor particle, both manufactured by Mitsubishi Chemical Corporation. (The phosphor colors refer to the light emitted by the phosphor particles when excited by blue or UV radiation.) As may be seen from Table 1, the relatively large difference in density between the two types of particles leads to about a factor of two difference in relative settling velocity (calculated using the differences in particle diameter and mass density), with the heavier particle having a larger settling velocity. The relative settling velocity was calculated using a binder density of about 1.25 gm/cm$^3$. The expression for relative settling velocity is $$\text{Relative } v_s = (\rho_p - \rho_f) R^2$$

where $\rho_p$ is the mass density of the particle, $\rho_f$ is the mass density of the fluid, and R is the radius of the particle.

TABLE 1

| Phosphor | Color | Radius (μm) | Density (gm/cm$^3$) | Relative Settling Velocity |
|---|---|---|---|---|
| BG801A | Green | 8.7 | 6.7 | 412 |
| BR102D | Red | 9.0 | 3.8 | 206 |

The relatively large difference in relative settling velocity may be minimized by adding a coating or shell of a material having a lower mass density than that of the phosphor particle itself. Table 2 shows the relative settling velocity for a BG801A particle coated with a coating material (e.g., polymeric binder) having a density of about 1.25. The total thickness of the phosphor particle and binder shell is 17.5 μm, which provides the coated phosphor particle with a relative settling velocity of 205, substantially the same as that of the uncoated red phosphor particle in Table 1.

TABLE 2

| Phosphor | Radius of Particle (μm) | Shell Thickness (μm) | Radius of Particle and Shell (μm) | Combined Density (gm/cm$^3$) | Relative Settling Velocity with Shell |
|---|---|---|---|---|---|
| BG801A | 8.7 | 8.8 | 17.5 | 1.9 | 205 |

In an embodiment of the present invention, the difference in relative settling velocities may be minimized by adding a coating or shell of a material having a higher mass density than that of the phosphor particle itself. Table 3 shows the relative settling velocity for a BR102D particle coated with a coating material having a density of about 4.9. The total thickness of the phosphor particle and binder shell is about 11.5 μm, which provides the coated phosphor particle with a relative settling velocity of 413, substantially the same as that of the uncoated green phosphor particle in Table 1.

TABLE 3

| Phosphor | Radius of Particle (μm) | Shell Thickness (μm) | Radius of Particle and Shell (μm) | Combined Density (gm/cm$^3$) | Relative Settling Velocity with Shell |
|---|---|---|---|---|---|
| BR102D | 9.0 | 2.5 | 11.5 | 4.4 | 413 |

In some embodiments of the present invention, the relative settling velocities of the two different particles (either or both of which may be coated with one or more coating materials) are within 20% of each other. In some embodiments of the present invention, the relative settling velocities of the two different particles are within 10% of each other, or even within 5% of each other. In some embodiments, the relative concentrations of the two particles at a given height or depth of the binder, for example in a direction substantially perpendicular to one of the top or bottom faces of light-emitting element 130, are within 20% of each other. In some embodiments the relative concentrations of the two particles at a given height or depth of the binder, for example in a direction substantially perpendicular to one of the top or bottom faces of light-emitting element 130, are within 10% of each other, or even within 5% of each other.

Figure 15:
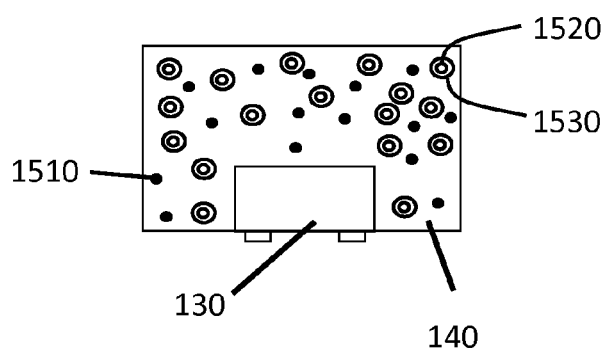
FIG. 15 is a schematic illustration of a lighting system in accordance with various embodiments of the invention.

FIG. 15 shows an example of one embodiment of the invention that includes binder 140, light-emitting element 130, and two types of phosphor particles 1510 and 1520, where phosphor particles 1520 are coated with a coating 1530.

In some embodiments the coating material includes or consists essentially of the same material as the binder, while in other embodiments the coating material is different from the binder material. In some embodiments, the coating material is transparent to a wavelength of light emitted by the light-emitting element and/or the light emitted by the phosphor particle. In some embodiments, the index of refraction of the coating material may be chosen or engineered to have a specific value to optimize one or more optical characteristics of the optical system. For example, in one embodiment the coating may have an index of refraction substantially equal to that of the binder in order to reduce total internal reflection loss between the phosphor particle and the binder. In one embodiment, the coating may have an index of refraction between that of the binder and that of the phosphor particle.

In another embodiment, the radii of the different types of particles (for example particle type 1 and particle type 2) may be varied, resulting in a relationship between the radius of particle 1 and the radius of particle 2 as:

$$\frac{R_1}{R_2} = \sqrt{\frac{\rho_{p2} - \rho_f}{\rho_{p1} - \rho_f}}$$

In this manner, the radii of the different types of phosphor particles may be selected to provide the phosphor particles with substantially equal settling rates within the binder.

While the discussion above is primarily based on blue LEEs and phosphors, that when combined produce white light, the concepts may be used with respect to LEEs emitting at any wavelength and phosphors or wavelength conversion materials with any emission wavelengths that may in combination or alone be used to produce light of any color.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A light-emitting device comprising:
   a bare light-emitting die having (i) a top face and a bottom face opposite the top face, at least one of the top or bottom face being configured for emission of light therefrom, and (ii) a sidewall spanning the top and bottom faces;
   a binder having top and bottom surfaces, at least one of which is substantially parallel to the top face of the die, wherein at least a portion of the binder is disposed over the top face of the light-emitting die; and
   disposed within the binder, a plurality of wavelength-conversion particles for absorbing at least a portion of light emitted from the light-emitting die and emitting converted light having a different wavelength, wherein (i) converted light and unconverted light emitted by the light-emitting die combine to form substantially white light, (ii) a divergence of color temperature of the substantially white light emitted from the light-emitting device varies, over an angular range of 0° to 70°, no more than 0.01 in terms of a Δu'v' deviation from a spatially weighted averaged chromaticity, and (iii) u' and v' are chromaticity coordinates on a chromaticity diagram,
   wherein (i) the plurality of wavelength-conversion particles comprises a first plurality of wavelength-conversion particles of a first type and a second plurality of wavelength-conversion particles of a second type different from the first type, (ii) throughout the binder, a concentration of the first plurality of wavelength-conversion particles relative to a total concentration of wavelength-conversion particles is within 20% of a concentration of the second plurality of wavelength-conversion particles relative to the total concentration of wavelength-conversion particles, (iii) the total concentration of the wavelength-conversion particles varies in a direction substantially perpendicular to at least one of the top or bottom faces without varying radially toward or away from the light-emitting die, (iv) the first type of wavelength-conversion particle has a first density, and (v) the second type of wavelength-conversion particle has a second density different from the first density.

2. The device of claim 1, wherein at least a portion of the binder extends laterally beyond the sidewall of the light-emitting die.

3. The device of claim 1, wherein at least one of the concentration of the first plurality of the wavelength-conversion particles or the concentration of the second plurality of the wavelength-conversion particles varies substantially linearly.

4. The device of claim 1, wherein at least one of the concentration of the first plurality of the wavelength-conversion particles or the concentration of the second plurality of the wavelength-conversion particles varies substantially stepwise linearly.

5. The device of claim 1, wherein, throughout the binder, the concentration of the first plurality of wavelength-conversion particles relative to the total concentration of wavelength-conversion particles is within 10% of the concentration of the second plurality of wavelength-conversion particles relative to the total concentration of wavelength-conversion particles.

6. The device of claim 1, wherein each of the first plurality of the wavelength-conversion particles is coated with a coating material.

7. The device of claim 6, wherein the coating material has a density greater than the first density.

8. The device of claim 7, wherein the second density is greater than the first density.

9. The device of claim 6, wherein the coating material has a density less than the first density.

10. The device of claim 9, wherein the second density is less than the first density.

11. The device of claim 6, wherein an index of refraction of the coating material is substantially equal to an index of refraction of the binder.

12. The device of claim 6, wherein an index of refraction of the coating material is between (i) an index of refraction of wavelength-conversion particles of at least one of the first or second types, and (ii) an index of refraction of the binder.

13. The device of claim 6, wherein the coating material and the binder comprise the same material.

14. The device of claim 6, wherein the coating material and the binder comprise different materials.

15. The device of claim 1, wherein the total concentration of the wavelength-conversion particles increases in a direction extending from the top face of the light-emitting die to the bottom face of the light-emitting die.

16. The device of claim 1, wherein the total concentration of the wavelength-conversion particles decreases in a direction extending from the top face of the light-emitting die to the bottom face of the light-emitting die.

17. The device of claim 1, wherein a portion of the binder extends proximate the sidewall of the light-emitting die below a plane defined by the top face of the light-emitting die.

18. The device of claim 1, wherein a portion of the binder is substantially free of wavelength-conversion particles.

19. The device of claim 1, wherein the light-emitting die comprises a GaN-based semiconductor material.

20. The device of claim 1, wherein the wavelength-conversion particles comprise phosphor particles.

21. The device of claim 1, wherein the divergence of color temperature of the substantially white light emitted from the light-emitting device varies, over an angular range of 0° to 80°, no more than 0.01 in terms of $\Delta u'v'$ deviation from a spatially weighted averaged chromaticity.

22. The device of claim 1, wherein the divergence of color temperature of the substantially white light emitted from the light-emitting device varies, over an angular range of 10° to 75°, no more than 0.005 in terms of $\Delta u'v'$ deviation from a spatially weighted averaged chromaticity.

23. The device of claim 1, further comprising:
 a substrate (i) having at least two conductive traces thereon and (ii) disposed proximate the bottom face of the light-emitting die; and
 a contact pad disposed on the light-emitting die and electrically connected to one of the at least two conductive traces on the substrate,
 wherein the contact pad is electrically connected to the conductive trace by at least one of (i) a wire bond, (ii) a solder joint, (iii) an anisotropic conductive adhesive, or (iv) a conductive adhesive.

24. The device of claim 23, wherein the substrate comprises a leadframe.

25. The device of claim 23, wherein the substrate comprises a rigid material selected from the group consisting of Si, SiC, AlN, AlON, sapphire, silicon oxide, SiAlON, SiCAlON, and alloys thereof.

26. The device of claim 23, further comprising a package in which at least a portion of the light-emitting die and at least a portion of the substrate are disposed.

27. The device of claim 26, wherein the package comprises at least one of a plastic material or a ceramic material.

28. The device of claim 1, wherein (i) the first type of wavelength-conversion particles emit light of a first color when excited by light from the light-emitting die, and (ii) the second type of wavelength-conversion particles emit light of a second color when excited by light from the light-emitting die, the second color being different from the first color.

29. The device of claim 28, wherein light emitted from the first type of wavelength-conversion particles, the light emitted from the second type of wavelength-conversion particles, and light emitted from the light-emitting die combine to form substantially white light.

\* \* \* \* \*